United States Patent
Arimura et al.

(10) Patent No.: US 7,075,463 B2
(45) Date of Patent: Jul. 11, 2006

(54) A/D CONVERTER, D/A CONVERTER AND VOLTAGE SOURCE

(75) Inventors: Kazuyoshi Arimura, Kasugai (JP); Atsushi Hayakawa, Kasugai (JP); Hidekiyo Ozawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/948,643

(22) Filed: Sep. 24, 2004

(65) Prior Publication Data

US 2005/0258995 A1 Nov. 24, 2005

(30) Foreign Application Priority Data

May 21, 2004 (JP) .............................. 2004-151438

(51) Int. Cl.
*H03M 1/06* (2006.01)
(52) U.S. Cl. ..................... 341/118; 341/155; 341/120
(58) Field of Classification Search ............... 341/155, 341/118, 120
See application file for complete search history.

(56) References Cited

U.S. PATENT DOCUMENTS

| | | | |
|---|---|---|---|
| 4,592,002 A | 5/1986 | Bozarth, Jr. et al. | |
| 5,319,370 A | 6/1994 | Signore et al. | |
| 6,307,496 B1 | 10/2001 | Ikuta et al. | |
| RE37,716 E | * 5/2002 | Sutardja et al. | ............. 341/118 |
| 6,606,048 B1 | * 8/2003 | Sutardja | ..................... 341/118 |
| 6,762,708 B1 | * 7/2004 | Sutardja | ..................... 341/118 |

FOREIGN PATENT DOCUMENTS

| | | |
|---|---|---|
| JP | 2000-031823 | 1/2000 |
| JP | 2000-201076 | 7/2000 |

* cited by examiner

*Primary Examiner*—Peguy JeanPierre
*Assistant Examiner*—Lam T. Mai
(74) *Attorney, Agent, or Firm*—Arent Fox PLLC

(57) ABSTRACT

A reference voltage generating circuit generates a reference voltage Vref. An A/D converting circuit compares an analog input voltage Vin with the reference voltage Vref to convert the analog input voltage Vin to a digital output value Dout. A measured value storing circuit stores a measured value of the reference voltage Vref in advance and outputs the stored measured value. A user of an A/D converter corrects the digital output value Dout from the A/D converting circuit by use of the measured value of the reference voltage Vref outputted from the measured value storing circuit, thereby obtaining a digital value representing the analog input voltage Vin accurately irrespective of the accuracy of the reference voltage Vref.

6 Claims, 17 Drawing Sheets

A/D CONVERTER, D/A CONVERTER AND VOLTAGE SOURCE

CROSS REFERENCE TO RELATED APPLICATION

This application is based upon and claims the benefit of priority from Japanese Patent Application No. 2004-151438, filed on May 21, 2004, the entire contents of which are incorporated herein by reference.

BACKGROUND OF THE INVENTION

1. Field of the Invention

The present invention relates to an A/D converter converting an analog input voltage to a digital output value, a D/A converter converting a digital input value to an analog output voltage, and a voltage source utilizing the D/A converter.

2. Description of the Related Art

An A/D converter compares an analog input voltage with a reference voltage and converts the analog input voltage to a digital output value based on a ratio of the analog input voltage and the reference voltage. For example, a digital output value Dout of a 10-bit A/D converter is expressed by the following expression (1), where an analog input voltage is Vin and a reference voltage is Vref.

$$Dout = (Vin/Vref) \times 1024 \quad (1)$$

A D/A converter converts a digital input value to an analog output voltage according to a reference voltage. A voltage source utilizing the D/A converter outputs the analog output voltage from the D/A converter as an output voltage of the voltage source. For example, in an 8-bit D/A converter, an analog output voltage Vout is expressed by the following expression (2), where a digital input value is Din and a reference voltage is Vref.

$$Vout = (Din/256) \times Vref \quad (2)$$

As is apparent from the expressions (1), (2), A/D conversion accuracy and D/A conversion accuracy depend on the accuracy of the reference voltage. Therefore, with the aim of improving the A/D conversion accuracy or D/A conversion accuracy a bandgap reference circuit, for example, is used for a reference voltage generating circuit in order to obtain a highly accurate reference voltage. A potential difference of a PN junction of a semiconductor has negative linear dependency on absolute temperature under a constant bias current. A potential difference between two PN junctions biased by current densities different from each other is proportional to the absolute temperature. The bandgap reference circuit utilizes these characteristics to generate a temperature-independent, accurate reference voltage.

Further, Japanese Unexamined Patent Application Publication No. 2000-31823 has disclosed an A/D converter capable of providing a high-accuracy digital output value even when a reference voltage fluctuates. This A/D converter first compares a digital output value obtained by A/D converting a voltage of a thermistor dependent on a power source voltage and temperature, with a digital output value obtained by A/D-converting a voltage of a resistor dependent only on power source voltage according to the reference voltage, thereby calculating a resistance value of the thermistor. Thereafter, the temperature at this moment is found using the calculated resistance value and a temperature characteristic of the thermistor, to find a voltage of a diode having only temperature dependency by use of the found temperature. Then, the reference voltage is estimated by an arithmetic operation using the found voltage and a digital output value obtained by A/D-converting the found voltage according to the reference voltage. A highly accurate digital output value is obtainable by correcting the digital output value from an A/D converting circuit according to the estimated reference voltage.

Further, Japanese Unexamined Patent Application Publication No. 2000-201076 has disclosed an A/D converter that controls, according to an A/D conversion rate, current consumptions of a comparing circuit for an analog input voltage and a reference voltage and of a reference voltage generating circuit, and thus is capable of A/D converting at a required A/D conversion rate with high efficiency without any unnecessary power consumption.

Meanwhile, if the user of an A/D converter knows a value of a reference voltage at the time of A/D conversion, he or she can acquire a digital value representing an analog input voltage accurately irrespective of the accuracy of the reference voltage, by correcting a digital output value from the A/D converter with use of the value of the reference voltage at the A/D conversion. However, a standard value of a reference voltage of the conventional A/D converter is specified but not an actual value of the reference voltage. Therefore, the user of the A/D converter cannot know a value of the reference voltage at the time of the A/D conversion. This makes it necessary for a manufacturer of the A/D converter to trim the reference voltage within a predetermined standard range (a range determined using a standard value as a reference) during the manufacturing process of the A/D converter in order to ensure A/D conversion accuracy. If there is an A/D converter with the reference voltage of a range not trimmed within the standard range, it is regarded as defective, resulting in a lowered manufacturing yield of A/D converters. Such a problem also occurs in D/A converters or voltage sources utilizing the D/A converters.

SUMMARY OF THE INVENTION

It is an object of the present invention to provide an A/D converter from which a digital value representing an analog input voltage accurately is obtainable irrespective of the accuracy of a reference voltage. It is another object of the present invention to provide a D/A converter capable of generating an accurate analog output voltage irrespective of the accuracy of a reference voltage. It is still another object of the present invention to provide a voltage source capable of generating an accurate output voltage irrespective of the accuracy of a reference voltage. It is yet another object of the present invention to improve manufacturing yields of A/D converters, D/A converters, and voltage sources.

According to one of the aspects of the A/D converter of the present invention, a reference voltage generating circuit generates a reference voltage. An A/D converting circuit compares an analog input voltage with the reference voltage to convert the analog input voltage to a digital output value. A measured value storing circuit stores a measured value of the reference voltage in advance and outputs the stored measured value. For example, during a manufacturing process of the A/D converter, the reference voltage is measured under a predetermined temperature to store the measured value in the measured value storing circuit.

A user of the A/D converter can obtain the measured value of the reference voltage corresponding to a value of the reference voltage at the time of A/D conversion. This allows the user of the A/D converter to correct the digital output value from the A/D converting circuit, using the measured value of the reference voltage outputted from the measured value storing circuit, and to obtain a digital value representing the analog input voltage accurately irrespective of the accuracy of the reference voltage. Further, the application of the present invention eliminates necessity for the manufacturer of the A/D converter to trim the reference voltage within a standard range during the manufacturing process; therefore, they can ship A/D converters with a reference voltage of a range not trimmed within the standard range as nondefective products, which have been regarded as defective conventionally. This realizes an improved manufacturing yield of the A/D converters.

In a preferable example of the above-described aspect of the A/D converter of the present invention, the measured value storing circuit holds measured values of the reference voltage corresponding to temperatures. A temperature information holding circuit holds temperature information representing a current ambient temperature of the A/D converter. An output control circuit selects, from measured values stored in the measured value storing circuit, a measured value corresponding to the temperature information held by the temperature information holding circuit to output the selected measured value. Therefore, the measured value of the reference voltage outputted from the A/D converter corresponds to the current ambient temperature of the A/D converter. This allows a user of the A/D converter to constantly obtain a digital value representing the analog input voltage accurately even when the reference voltage varies with the ambient temperature of the A/D converter.

In a preferable example of the above-described aspect of the A/D converter of the present invention, a measurement voltage generating circuit generates a measurement voltage for temperature measurement that varies with the ambient temperature of the A/D converter. A selecting circuit selects, for output to the A/D converting circuit, the measurement voltage as the analog input voltage, and thereafter selects an external input voltage for output. In other words, the A/D converting circuit A/D-converts the external input voltage after the measurement voltage. The temperature information holding circuit holds as the temperature information the digital output value that is outputted from the A/D converting circuit in response to the selection of the measurement voltage by the selecting circuit. The use of the A/D converting circuit for generating the temperature information makes it possible to generate the temperature information to be held in the temperature information holding circuit with a simple circuit configuration.

In a preferable example of the above-described aspect of the A/D converter of the present invention, the measurement voltage generating circuit has a first resistor element having temperature independency and a second resistor element having temperature dependency. The first resistor element and the second resistor element are connected in series between a supply line of the reference voltage and a ground line. The measurement voltage is a voltage of a connecting node between the first resistor element and the second resistor element. That is, the measurement voltage varies depending on a temperature characteristic of the second resistor element. This facilitates generation of the measurement voltage that varies with the ambient temperature of the A/D converter.

In a preferable example of the above-described aspect of the A/D converter of the present invention, a measurement voltage generating circuit generates a measurement voltage for temperature measurement that varies with the ambient temperature of the A/D converter. A selecting circuit selects, for output to the A/D converting circuit, the measurement voltage as an analog input voltage, and thereafter outputs an external input voltage. That is, the A/D converting circuit A/D-converts the external input voltage after the measurement voltage. The temperature information holding circuit holds as the temperature information a digital value which corresponds a temperature found by an external control circuit according to the digital output value that is outputted from the A/D converting circuit in response to the selection of the measurement voltage by the selecting circuit.

The user of the A/D converter can acquire a temperature characteristic of the reference voltage by obtaining the measured values of the reference voltage in sequence while allowing the external control circuit to vary the digital value to be held as the temperature information in the temperature information holding circuit. Therefore, even in a case where there is no available measured value corresponding to the current ambient temperature of the A/D converter, for example, it is possible to correct the digital output value from the A/D converting circuit by use of the obtained temperature characteristic of the reference voltage, and to thus acquire a digital value representing the analog input voltage with higher accuracy. This enables a reduction in the scale of the measured value storing circuit mounted in the A/D converter and a simplification of the circuit configuration of the A/D converter.

In a preferable example of the above-described aspect of the A/D converter of the present invention, a standard value storing circuit stores therein a standard value of the reference voltage in advance and outputs the stored standard value. A correcting circuit corrects, according to the measured value and the standard value of the reference voltage, the digital output value from the A/D converting circuit to a digital value whose basic value is the standard value of the reference voltage, and outputs the digital value. This allows the user of the A/D converter to constantly obtain the digital value representing the analog input voltage accurately without correcting the digital output value from the A/D converting circuit.

According to one of the aspects of the D/A converter of the present invention, a reference voltage generating circuit generates a reference voltage. A D/A converting circuit converts a digital input value to an analog output voltage according to the reference voltage. A measured value storing circuit stores therein a measured value of the reference voltage in advance and outputs the stored measured value. For example, during a manufacturing process of the D/A converter the reference voltage is measured under a predetermined temperature for storage in the measured value storing circuit.

A user of the D/A converter can obtain the measured value of the reference voltage corresponding to a value of the reference voltage at the time of D/A conversion. Therefore, the D/A converting circuit is supplied with the digital input value as a digital value whose basic value is the measured value of the reference voltage from the measured value storing circuit, so that it can generate the analog output voltage with accuracy irrespective of the accuracy of the reference voltage. In addition, a manufacturer of the D/A converter need not trim the reference voltage within a standard range during the manufacturing process of the D/A converter, and hence, with application of the present invention they can ship D/A converters with a reference voltage of a range not trimmed within the standard range as nondefective products, which have been regarded as defective conventionally. This realizes an improved manufacturing yield of the D/A converters.

In a preferable example of the above-described aspect of the D/A converter of the present invention, the measured value storing circuit holds measured values of the reference voltage corresponding to temperatures. A measurement voltage generating circuit generates a measurement voltage for temperature measurement that varies with an ambient temperature of the D/A converter. An A/D converting circuit compares the measurement voltage as an analog input voltage with the reference voltage to convert the measurement voltage to a digital output value. An output control circuit selects from measured values stored in the measured value storing circuit the measured value corresponding to the digital output value from the A/D converting circuit to output the selected measured value. Therefore, the measured value of the reference voltage outputted from the D/A converter corresponds to the current ambient temperature of the D/A converter. This enables constant generation of an accurate analog output voltage even when the reference voltage varies with the ambient temperature of the D/A converter.

In a preferable example of the above-described aspect of the D/A converter of the present invention, the measurement voltage generating circuit has a first resistor element having temperature independency and a second resistor element having temperature dependency. The first resistor element and the second resistor element are connected in series between a supply line of the reference voltage and a ground line. The measurement voltage is a voltage of a connecting node between the first resistor element and the second resistor element. This means that the measurement voltage varies depending on a temperature characteristic of the second resistor element. This facilitates generation of the measurement voltage that varies with the ambient temperature of the D/A converter.

According to one of the aspects of the voltage source of the present invention, an output voltage setting circuit is for setting a digital value corresponding to a desired output voltage. A D/A converter uses the set digital value as a digital input value, and it has a reference voltage generating circuit, a D/A converting circuit, and a measured value storing circuit. The reference voltage generating circuit generates a reference voltage. The D/A converting circuit converts the digital input value to an analog output voltage according to the reference voltage and outputs the analog output voltage as an output voltage of the voltage source. The measured value storing circuit stores therein a measured value of the reference voltage in advance and outputs the stored measured value. For example, during a manufacturing process of the voltage source, the reference voltage is measured under a predetermined temperature to store the measured value in the measured value storing circuit.

A user of the voltage source can acquire the measured value of the reference voltage corresponding to a value of the reference voltage at the time of the D/A conversion. Therefore, it is possible to generate the output voltage with accuracy irrespective of the accuracy of the reference voltage by setting, with the output voltage setting circuit, a digital value whose basic value is the measured value of the reference voltage outputted from the measured value storing circuit. Further, a manufacturer of the voltage source need not trim the reference voltage within a standard range during the manufacturing process of the voltage source; therefore, with the application of the present invention they can ship voltage sources with a reference voltage of a range not trimmed within the standard range as nondefective products, which have been considered defective conventionally. This realizes an improved manufacturing yield of the voltage sources.

In a preferable example of the above-described aspect of the voltage source of the present invention, the D/A converter includes the measured value storing circuit storing therein measured values of the reference voltage corresponding to temperatures, a measurement voltage generating circuit, an A/D converting circuit, and an output control circuit. The measurement voltage generating circuit generates a measurement voltage for temperature measurement that varies with an ambient temperature of the voltage source. The A/D converting circuit compares the measurement voltage as an analog input voltage with the reference voltage to convert the measurement voltage to a digital output value. The output control circuit selects, from measured values stored in the measured value storing circuit, a measured value corresponding to the digital output value from the A/D converting circuit to output the selected measured value. Therefore, the measured value of the reference voltage outputted from the voltage source corresponds to the current ambient temperature of the voltage source. This enables constant generation of an accurate output voltage even when the reference voltage varies with the ambient temperature of the voltage source.

In a preferable example of the above-described aspect of the voltage source of the present invention, the measurement voltage generating circuit has a first resistor element having temperature independency and a second resistor element having temperature dependency. The first resistor element and the second resistor element are connected in series between a supply line of the reference voltage and a ground line. The measurement voltage is a voltage of a connecting node between the first resistor element and the second resistor element. That is, the measurement voltage varies depending on a temperature characteristic of the second resistor element. This facilitates generation of the measurement voltage that varies with the ambient temperature of the voltage source.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 111 is a block diagram showing a second embodiment of the A/D converter of the present invention;

DESCRIPTION OF THE PREFERRED EMBODIMENTS

Hereinafter, embodiments of the present invention will be described, using the drawings.

Figure 1:
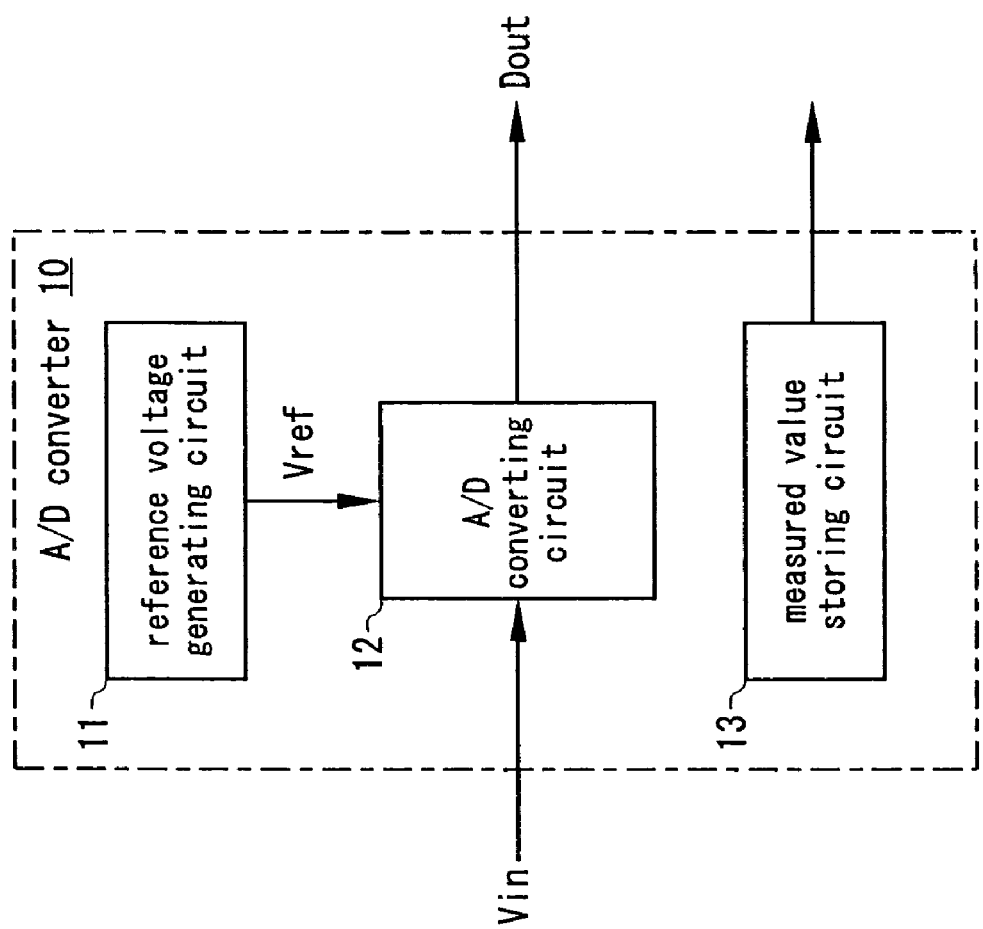
FIG. 1 is a block diagram of a first principle of the A/D converter of the present invention.

FIG. 1 shows a first basic principle of the A/D converter of the present invention. An A/D converter 10 has a reference voltage generating circuit 11, an A/D converting circuit 12, and a measured value storing circuit 13. The reference voltage generating circuit 11 generates a reference voltage Vref to output it to the A/D converting circuit 12. The A/D converting circuit 12 compares an analog input voltage Vin with the reference voltage Vref to convert the analog input voltage Vin to a digital output value Dout and outputs the digital output value Dout. The measured value storing circuit 13 stores a measured value of the reference voltage Vref in advance and outputs the stored measured value.

Figure 2:
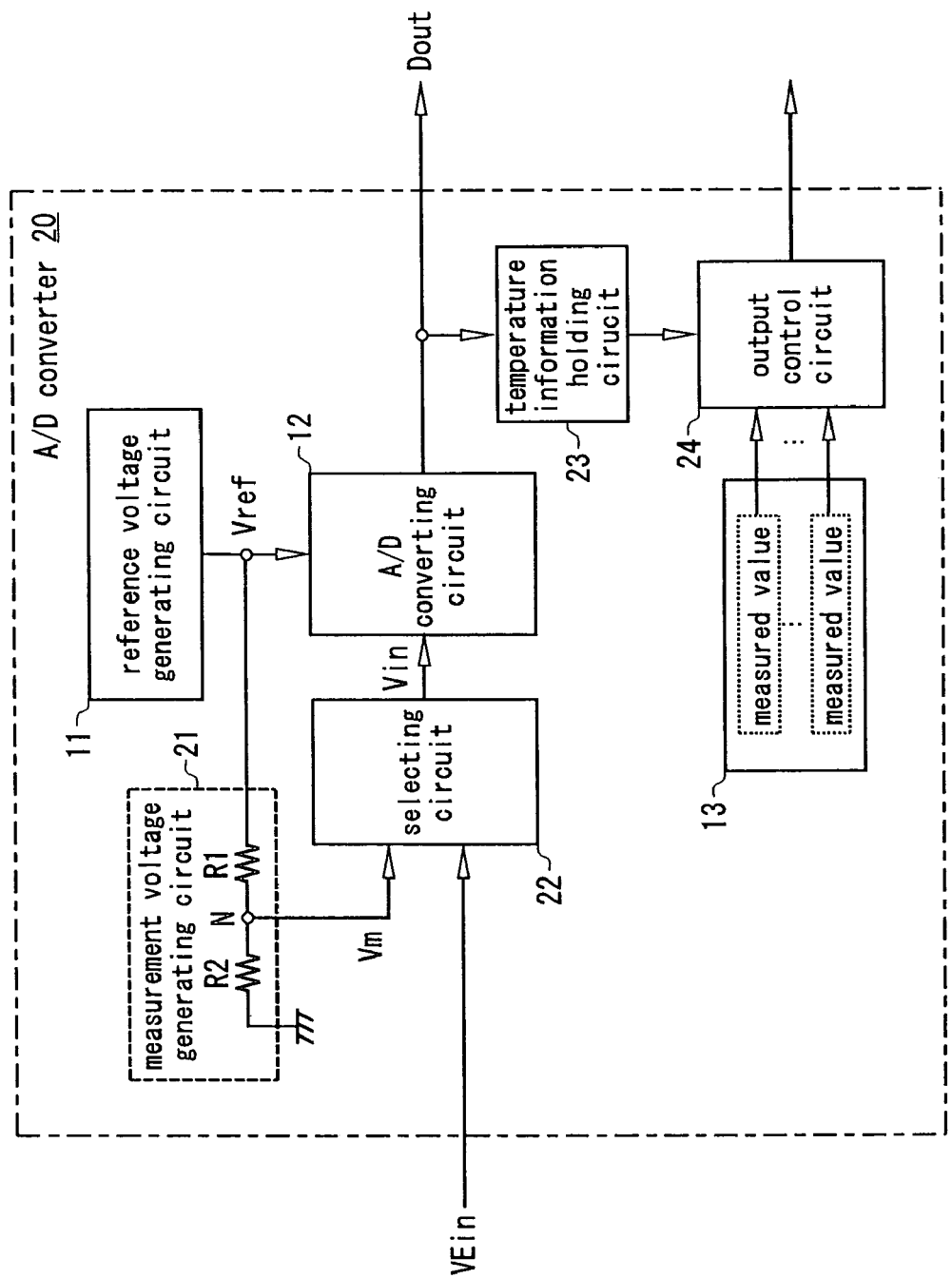
FIG. 2 is a block diagram of a second principle of the A/D converter of the present invention.

FIG. 2 shows a second basic principle of the A/D converter of the present invention. The same reference numerals and symbols are used to designate the same elements as the elements described in FIG. 1, and description thereof will not be given. An A/D converter 20 has a reference voltage generating circuit 11, an A/D converting circuit 12, a measured value storing circuit 13 holding a plurality of measured values of a reference voltage Vref corresponding to a plurality of temperatures, a measurement voltage generating circuit 21, a selecting circuit 22, a temperature information holding circuit 23 for holding temperature information representing a current ambient temperature of the A/D converter 20, and an output control circuit 24.

The measurement voltage generating circuit 21 generates a measurement voltage Vm for temperature measurement that varies with the ambient temperature of the A/D converter 20. For example, the measurement voltage generating circuit 21 has a first resistor element R1 having temperature independency and a second resistor element R2 having temperature dependency. The first resistor element R1 and the second resistor element R2 are connected in series between a supply line of the reference voltage Vref and a ground line. The measurement voltage Vm is a voltage of a connecting node N between the first resistor element R1 and the second resistor element R2. Therefore, the measurement voltage Vm varies according to the temperature characteristic of the second resistor element R2.

As an analog input voltage Vin of the A/D converting circuit 12, the selecting circuit 22 selects an external input voltage VEin for output after the measurement voltage Vm. In other words, the A/D converting circuit 12 A/D-converts the external input voltage VEin after the measurement voltage Vm. The temperature information holding circuit 23 holds as temperature information a digital output value Dout that is outputted from the A/D converting circuit 12 as a result of the selection of the measurement voltage Vm by the selecting circuit 22. The output control circuit 24 selects from measured values stored in the measured value storing circuit 13 a measured value corresponding to the temperature information held by the temperature information holding circuit 23 to output the selected measured value.

Figure 3:
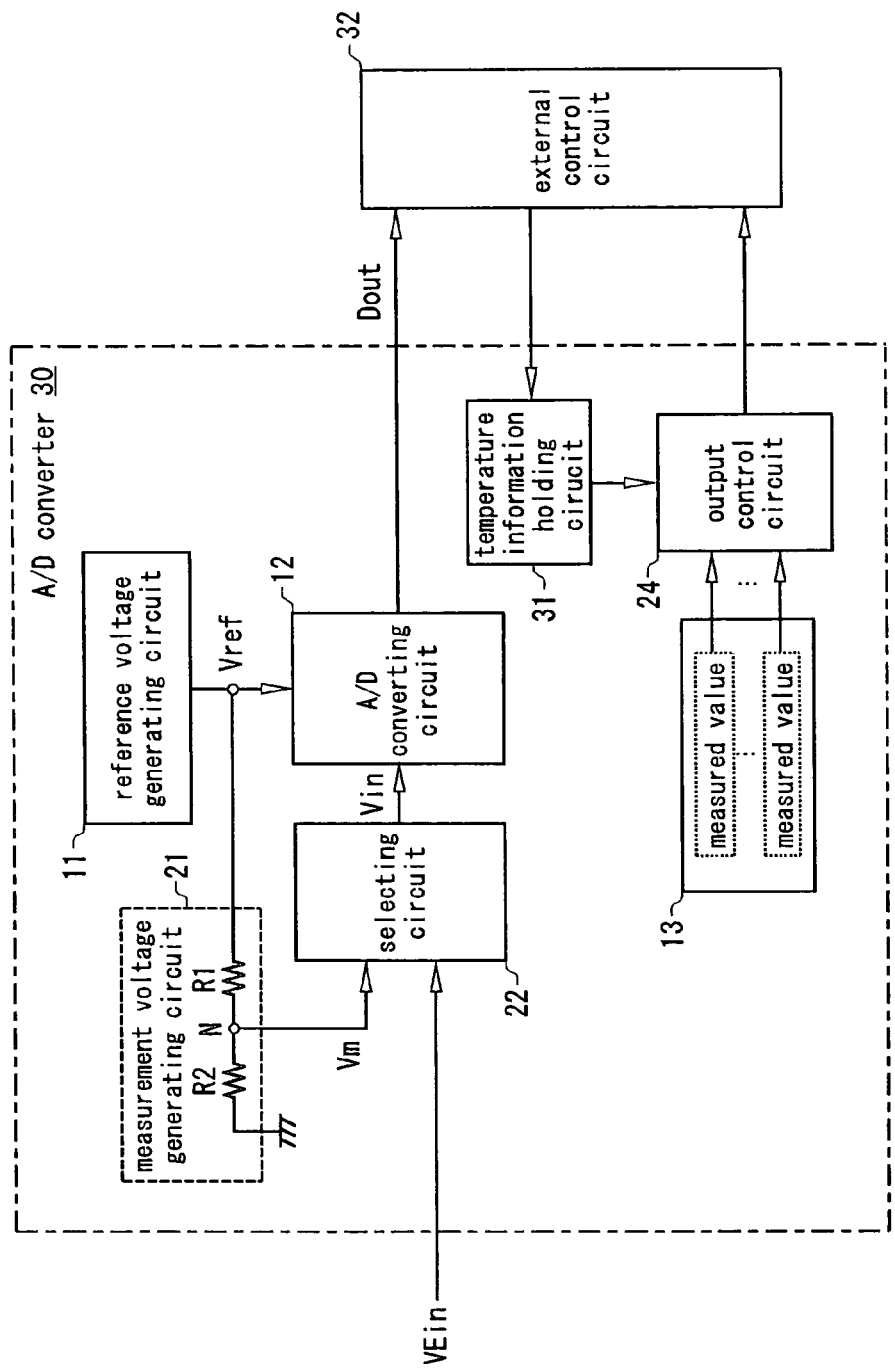
FIG. 3 is a block diagram of a third principle of the A/D converter of the present invention.

FIG. 3 shows a third basic principle of the A/D converter of the present invention. The same reference numerals and symbols are used to designate the same elements as the elements described in FIG. 1 and FIG. 2, and description thereof will not be given. An A/D converter 30 is the same as the A/D converter 20 in FIG. 2 except that it has a temperature information holding circuit 31 in place of the temperature information holding circuit 23. The temperature information holding circuit 31 holds as temperature information a digital value corresponding to a temperature that is found by an external control circuit 32 based on a digital output value Dout that is outputted from the A/D converting circuit 12 as a result of the selection of a measurement voltage Vm by a selecting circuit 22.

Figure 4:
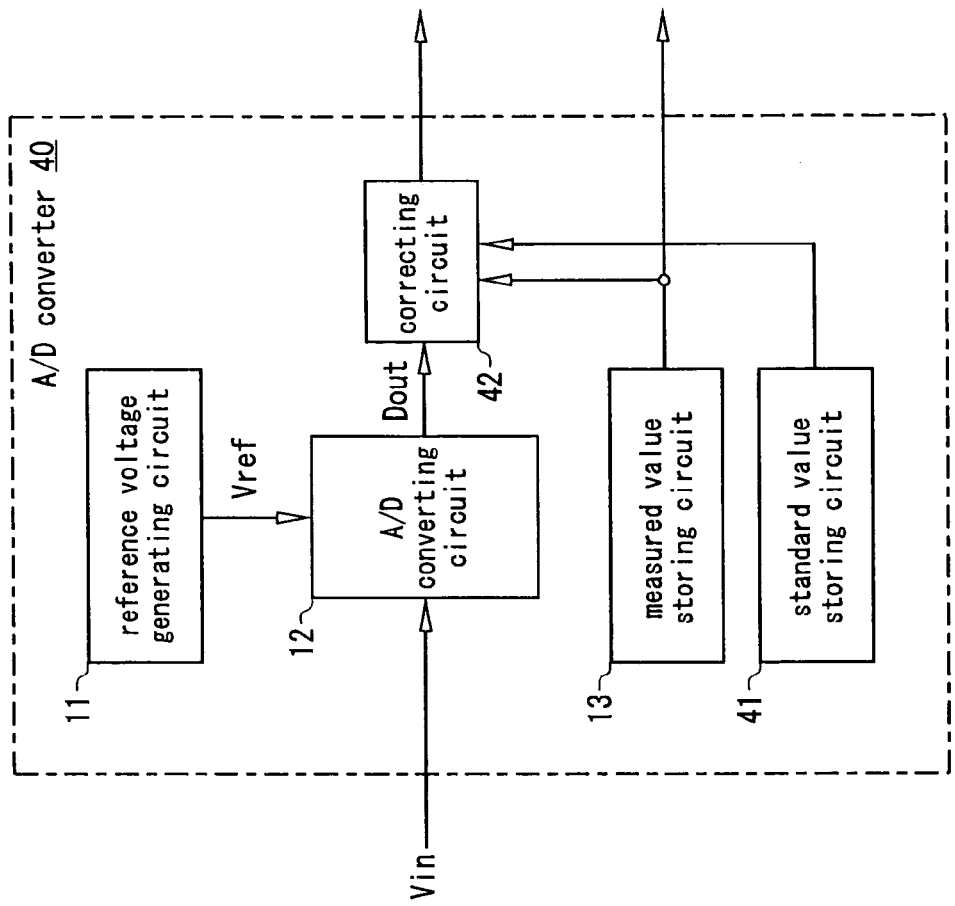
FIG. 4 is a block diagram of a fourth principle of the A/D converter of the present invention.

FIG. 4 shows a fourth basic principle of the A/D converter of the present invention. The same reference numerals and symbols are used to designate the same elements as the elements described in FIG. 1, and description thereof will not be given. An A/D converter 40 is configured by adding a standard value storing circuit 41 and a correcting circuit 42 to the A/D converter 10 in FIG. 1. The standard value storing circuit 41 stores therein a standard value of a reference voltage Vref in advance and outputs the stored standard value to the correcting circuit 42. According to a measured value of the reference voltage Vref from the measured value storing circuit 13 and the standard value of the reference voltage Vref from the standard value storing circuit 41, the correcting circuit 42 corrects a digital output value Dout from the A/D converting circuit 12 to a digital value whose basic value is the standard value of the reference voltage Vref, and outputs the digital value.

Figure 5:
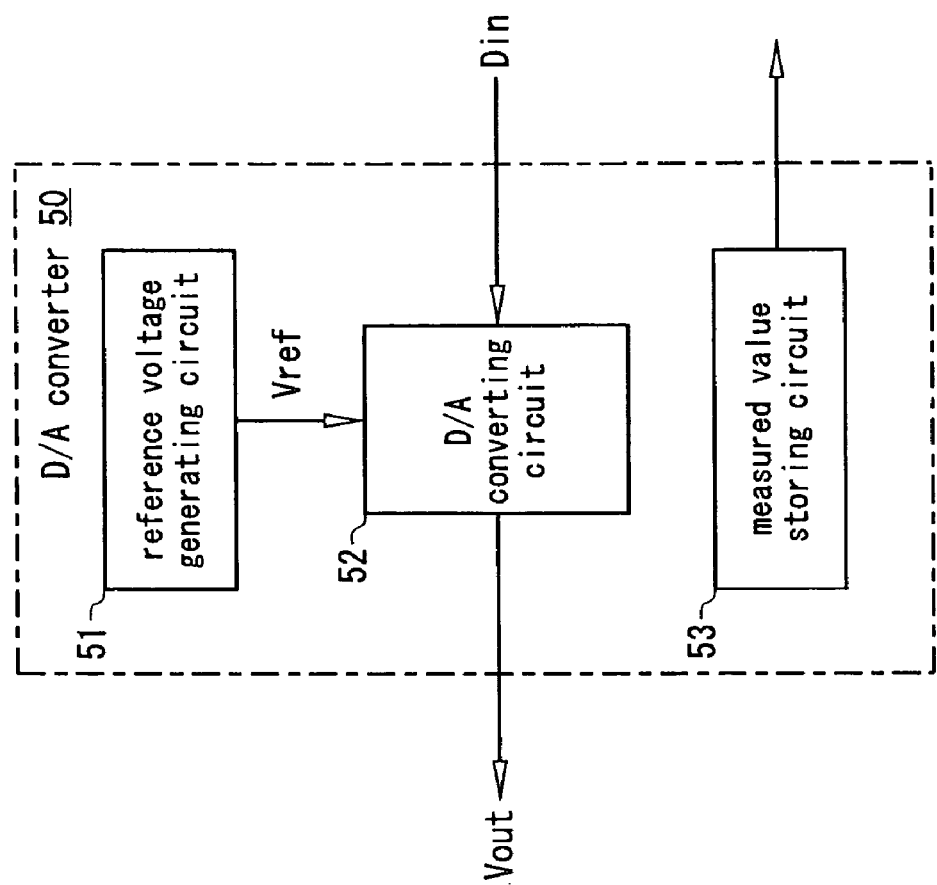
FIG. 5 is a block diagram of a first principle of the D/A converter of the present invention.

FIG. 5 shows a first basic principle of the D/A converter of the present invention. A D/A converter 50 has a reference voltage generating circuit 51, a D/A converting circuit 52, and a measured value storing circuit 53. The reference voltage generating circuit 51 generates a reference voltage Vref to output it to the D/A converting circuit 52. The D/A converting circuit 52 converts a digital input value Din to an analog output voltage Vout according to the reference voltage Vref to output the analog output voltage Vout. The measured value storing circuit 53 stores a measured value of the reference voltage Vref in advance and outputs the stored measured value.

Figure 6:
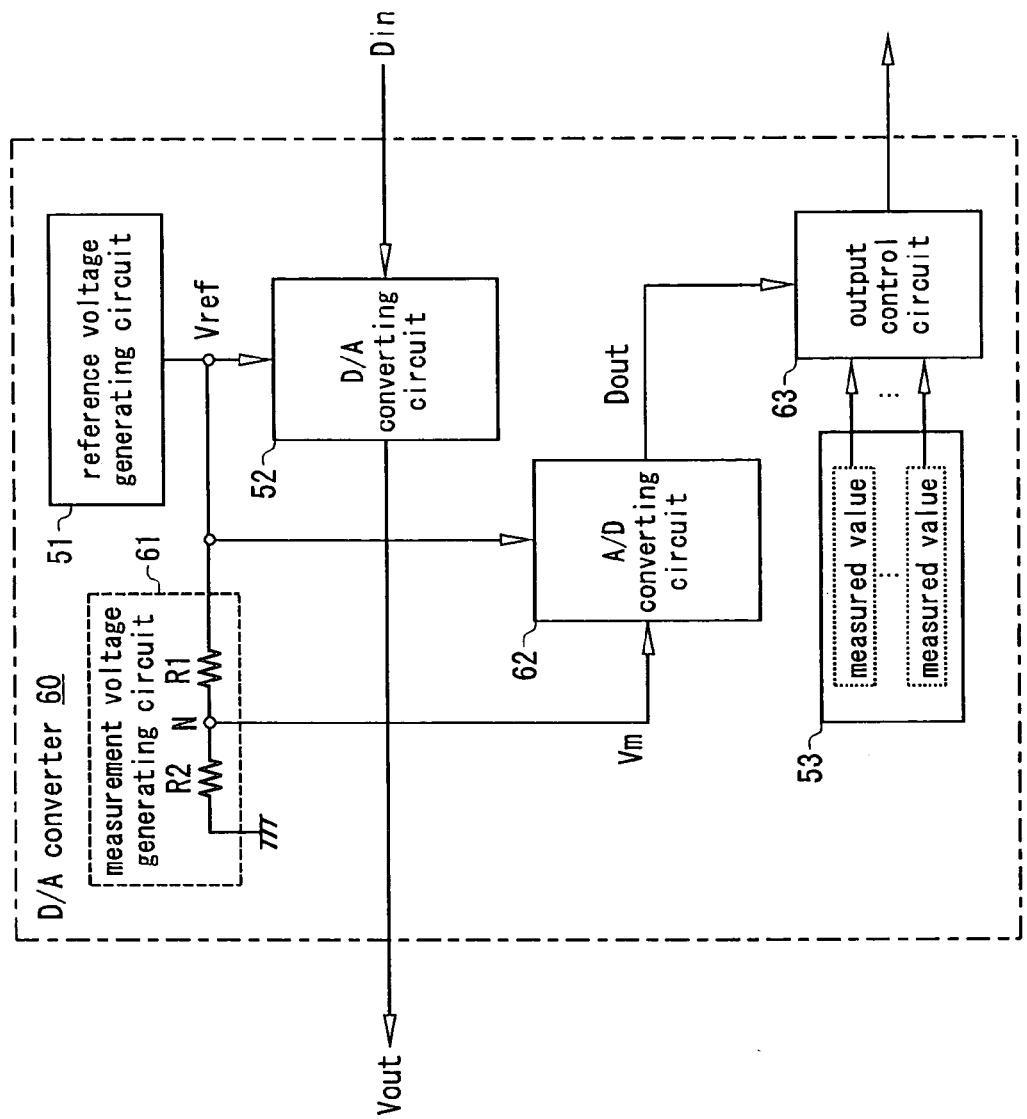
FIG. 6 is a block diagram of a second principle of the D/A converter of the present invention.

FIG. 6 shows a second basic principle of the D/A converter of the present invention. The same reference numerals and symbols are used to designate the same elements as the elements described in FIG. 5, and description thereof will not be given. A D/A converter 60 has a reference voltage generating circuit 51, a D/A converting circuit 52, a measured value storing circuit 53 holding a plurality of measured values of a reference voltage Vref corresponding to a plurality of temperatures, a measurement voltage generating circuit 61, an A/D converting circuit 62, and an output control circuit 63.

The measurement voltage generating circuit 61 generates a measurement voltage Vm for temperature measurement that varies with the ambient temperature of the D/A converter 60. For example, the measurement voltage generating circuit 61 has a first resistor element R1 having temperature independency and a second resistor element R2 having temperature dependency. The first resistor element R1 and the second resistor element R2 are connected in series between a supply line of the reference voltage Vref and a ground line. The measurement voltage Vm is a voltage of a connecting node N of the first resistor element R1 and the second resistor element R2. Therefore, the measurement voltage Vm varies according to the temperature characteristic of the second resistor element R2. The A/D converting circuit 62 compares the measurement voltage Vm as an analog input voltage with the reference voltage Vref to convert the measurement voltage Vm to a digital output value Dout and outputs the digital output value Dout to the output control circuit 63. The output control circuit 63 selects from measured values stored in the measured value storing circuit 53 a measured value corresponding to the digital output value Dout from the A/D converting circuit 62 to output the selected measured value.

Figure 7:
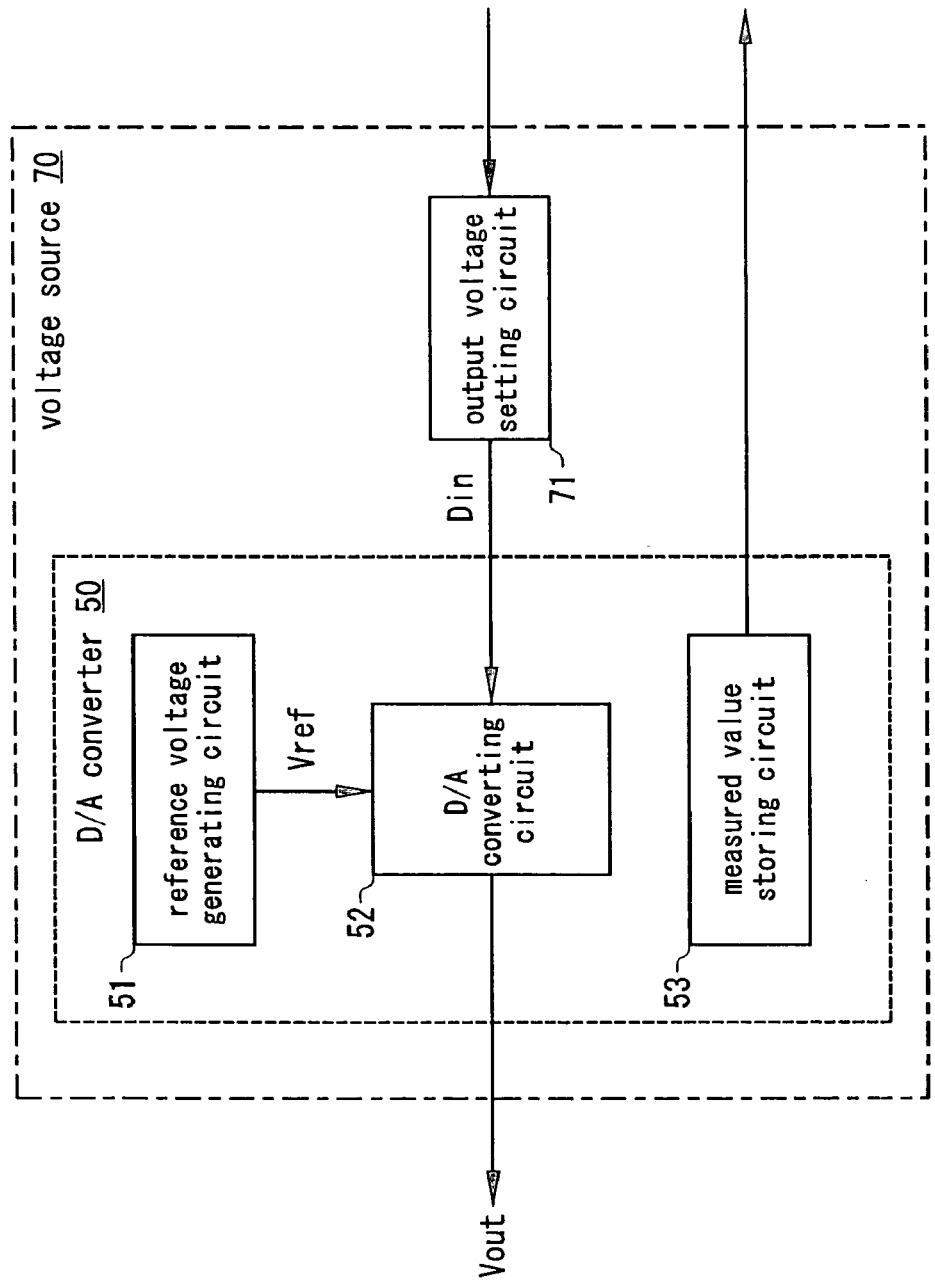
FIG. 7 is a block diagram of a first principle of the voltage source of the present invention.

FIG. 7 shows a first basic principle of the voltage source of the present invention. The same reference numerals and symbols are used to designate the same elements as the elements described in FIG. 5, and description thereof will not be given. A voltage source 70 has an output voltage setting circuit 71 and the D/A converter 50 in FIG. 5. A digital value corresponding to a desired output voltage is set at the output voltage setting circuit 71. The D/A converter 50 uses the set digital value as a digital input value Din. The D/A converting circuit 52 of the D/A converter 50 outputs an analog output voltage Vout as an output voltage of the voltage source 70.

Figure 8:
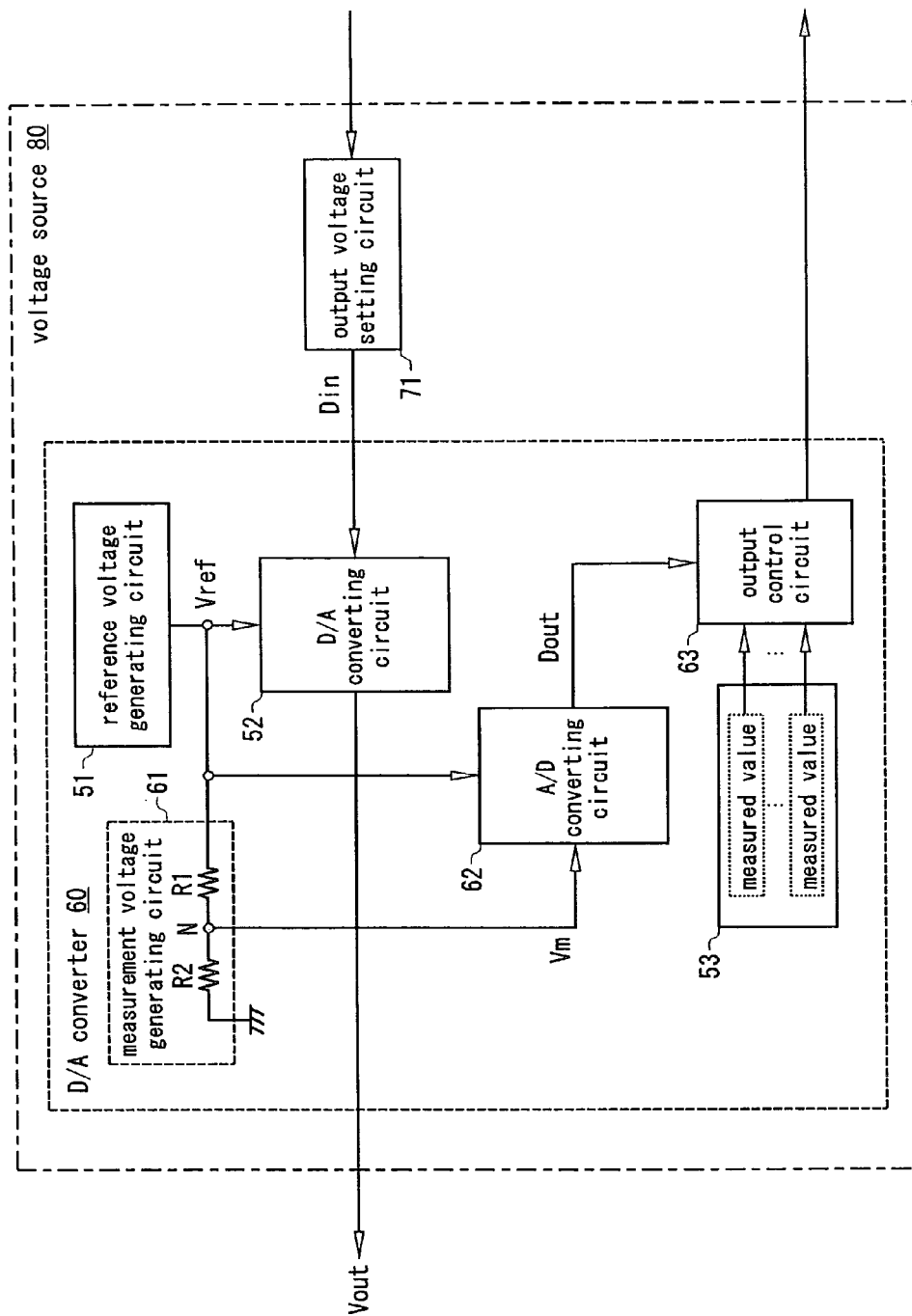
FIG. 8 is a block diagram of a second principle of the voltage source of the present invention.

FIG. 8 shows a second basic principle of the voltage source of the present invention. The same reference numerals and symbols are used to designate the same elements as the elements described in FIG. 5 to FIG. 7, and description thereof will not be given. A voltage source 80 has an output voltage setting circuit 71 and the D/A converter 60 in FIG. 6. The D/A converter 60 uses a digital value set at the output voltage setting circuit 71 as a digital input value Din. The D/A converting circuit 52 of the D/A converter 60 outputs an analog output voltage Vout as an output voltage of the voltage source 80.

Figure 9:
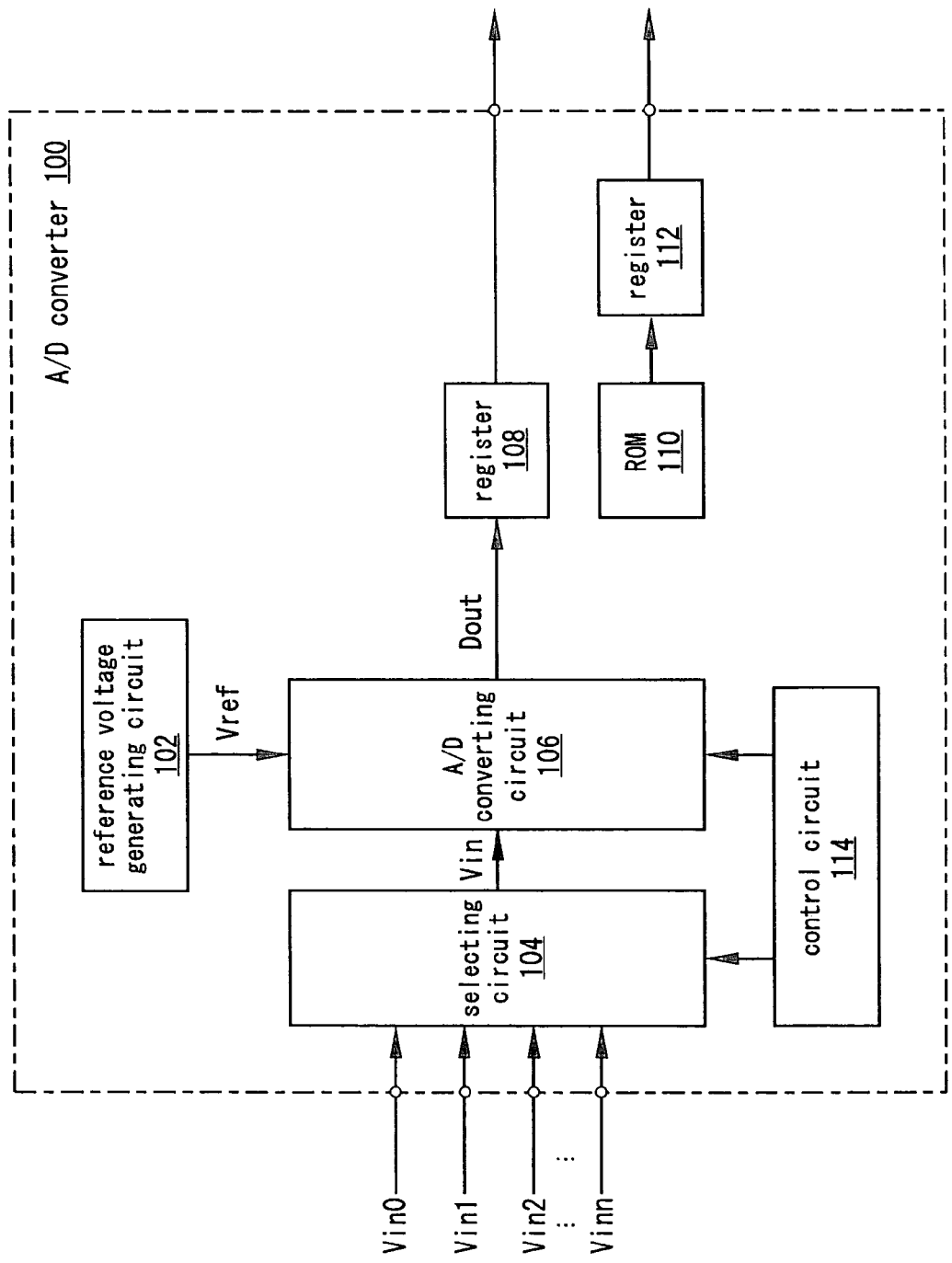
FIG. 9 is a block diagram showing a first embodiment of the A/D converter of the present invention.

FIG. 9 shows a first embodiment of the A/D converter of the present invention. An A/D converter 100 is, for example, a 10-bit A/D converter formed as a semiconductor integrated circuit chip, and it has a reference voltage generating circuit 102, a selecting circuit 104, an A/D converting circuit 106, a 10-bit register 108, a ROM 110 (a measured value storing circuit), a 10-bit register 112, and a control circuit 114 controlling the whole A/D converter 100.

Figure 10:
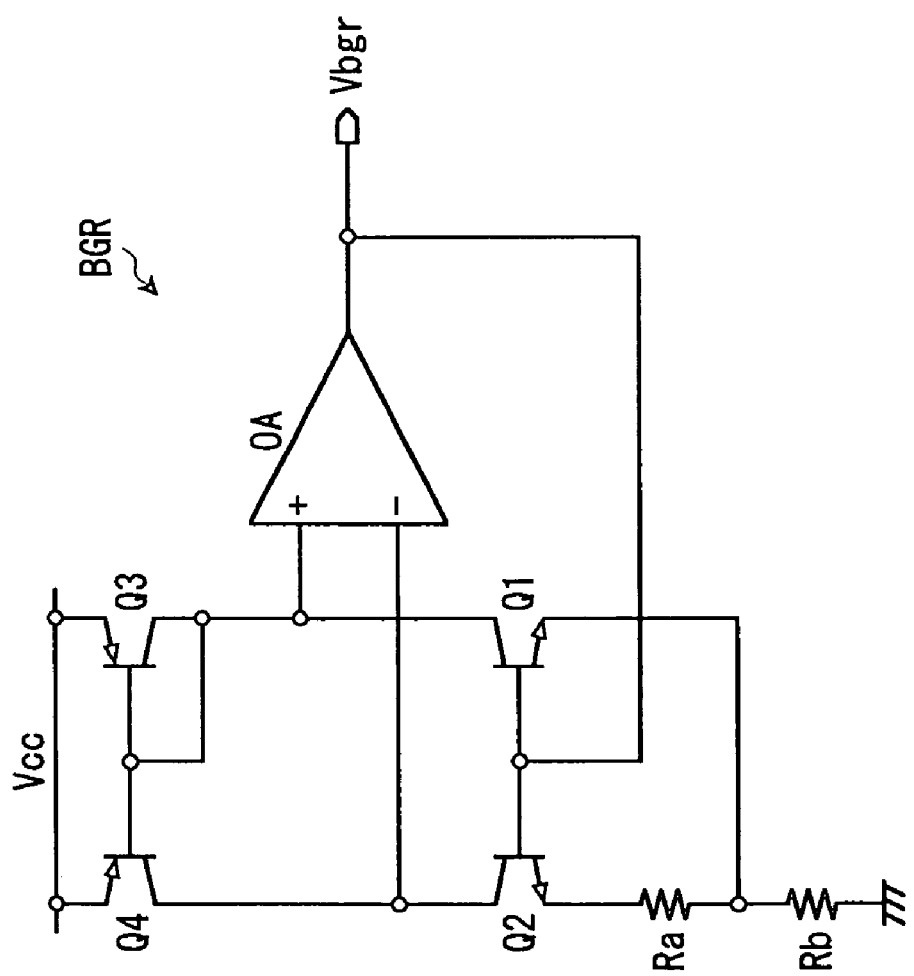
FIG. 10 is a circuit diagram showing an example of a bandgap reference circuit.

The reference voltage generating circuit 102 generates a reference voltage Vref to output it to the A/D converting circuit 106. The reference voltage generating circuit 102 is constituted of a known bandgap reference circuit BGR, for example, as shown in FIG. 10. The bandgap reference circuit BGR stably outputs a bandgap voltage Vbgr (approximately 1.2 V) of silicon independently of the ambient temperature.

The selecting circuit 104 selects one of external input voltages Vin0 to Vinn according to an instruction from the control circuit 114 to output it as an analog input voltage Vin to the A/D converting circuit 106. According to an instruction from the control circuit 114, the A/D converting circuit 106 compares the analog input voltage Vin outputted from the selecting circuit 104 with the reference voltage Vref outputted from the reference voltage generating circuit 102 to convert the analog input voltage Vin to a 10-bit digital output value Dout and outputs the digital output value Dout to the register 108.

Every time the A/D converting circuit 106 performs A/D conversion, for example, the register 108 accepts the digital output value Dout outputted therefrom. A register value of the register 108 is readable via an external terminal. Therefore, a user (system) of the A/D converter 100 is able to obtain the digital output value Dout (the result of the A/D conversion) from the A/D converting circuit 106 by reading the register value of the register 108.

The ROM 110 is a nonvolatile memory such as a fuse or EEPROM, and it stores a measured value (10-bit digital value) of the reference voltage Vref in advance and outputs the stored measured value to the register 112. Incidentally, the A/D converter 100 has, for example, a monitor pad for monitoring the reference voltage Vref, and a write pad and a write circuit for data write to the ROM 110, though they are not shown in the drawing. At the probe inspection during a manufacturing process of the A/D converter 100, the measured value of the reference voltage Vref is obtained via the monitor pad under a predetermined temperature, and written to the ROM 110 via the write pad and the write circuit.

The register 112 accepts the measured value of the reference voltage Vref outputted from the ROM 110, for example, upon power-on reset of the A/D converter 100. A register value of the register 112, similarly to that of the register 108, is readable via an external terminal. Therefore, a user of the A/D converter 100 can obtain the measured value of the reference voltage Vref by reading the register value of the register 112.

For example, when a standard value of the reference voltage Vref is 5.0 V, a value of the analog input voltage Vin is 1.25 V, and a value of the reference voltage Vref at the time of A/D conversion is 4.9 V, the digital output value Dout from the A/D converting circuit 106 (the register value of the register 108) is given by the expression (1) as 261. Further, the measured value of the reference voltage Vref outputted from the ROM 110 (the register value of the register 112) is 1003 representing 4.9 V. Therefore, a user of the A/D converter 100 obtains a digital value (256) representing the analog input voltage Vin (1.25 V) accurately by correcting the digital output value Dout (261) from the A/D converting circuit 106 according to a ratio of the standard value (1024) of the reference voltage Vref and the measured value (1003).

On the other hand, with regard to a conventional A/D converter, that is, one having no ROM 110, since the user cannot know the value (4.9 V) of the reference voltage Vref at the time of A/D conversion, he or she cannot correct the digital output value Dout (261) from the A/D converting circuit 106. This consequently creates an error between an actual value of the analog input voltage Vin and a value the user of the A/D converter knows.

As described above, in this embodiment, the user of the A/D converter 100 uses the measured value of the reference voltage Vref obtained by reading the register value of the register 112 to correct the digital output value Dout from the A/D converting circuit 106 obtained by reading the register value of the register 108, so that the user is able to obtain the digital value representing the analog input voltage Vin accurately (namely, a desired external input voltage of the external input voltages Vin0 to Vinn). Further, a manufacturer of the A/D converter 100 need not trim the reference voltage Vref within a standard range during a manufacturing process of the A/D converter 100, so that they can ship A/D converters with a reference voltage Vref of a range not trimmed within the standard range as nondefective, which has conventionally been dealt as defective. This can enhance a manufacturing yield of the A/D converter 100.

Figure 11:
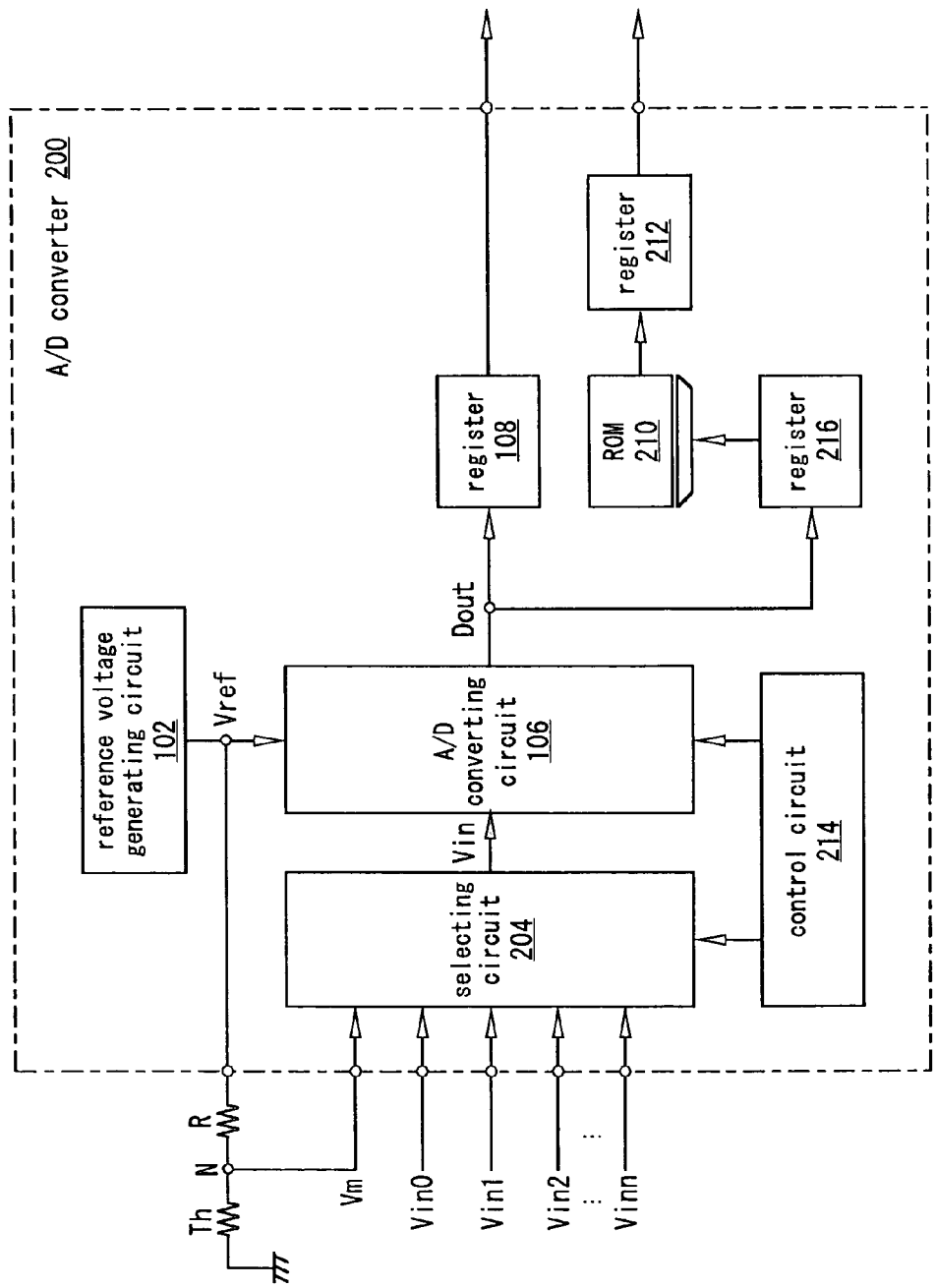

FIG. 11 shows a second embodiment of the A/D converter of the present invention. The same reference numerals and symbols are used to designate the same elements as the elements described in the first embodiment of the A/D converter, and detailed description thereof will not be given. Similarly to the A/D converter 100 of the first embodiment, an A/D converter 200 is, for example, a 10-bit A/D converter formed as a semiconductor integrated circuit chip, and it has a reference voltage generating circuit 102, a selecting circuit 204, an A/D converting circuit 106, a register 108, a ROM 210 (a measured value storing circuit, an output control circuit), a 10-bit register 212, a control circuit 214 controlling the whole A/D converter 200, a 10-bit register 216 (a temperature information holding circuit), and an external high-accuracy resistor R and thermistor Th (a measurement voltage generating circuit).

The high-accuracy resistor R (a first resistor element) and a thermistor Th (a second resistor element) are connected in series between a supply line of a reference voltage Vref and a ground line. A voltage of a connecting node N of the high-accuracy resistor R and the thermistor Th is outputted as a measurement voltage Vm to the selecting circuit 204. The high-accuracy resistor R has temperature independency, in other words, a resistance value thereof is substantially constant irrespective of the ambient temperature of the A/D converter 200. The thermistor Th has temperature dependency, in other words, a resistance value thereof changes in accordance with the ambient temperature of the A/D converter 200. This means that the measurement voltage Vm varies according to the temperature characteristic of the thermistor Th, or it varies with the ambient temperature of the A/D converter 200. Such a measurement voltage Vm can be expressed by the following expression (3).

$$Vm = \{Th/(R+Th)\} \times Vref \quad (3)$$

According to an instruction from the control circuit 214, the selecting circuit 204 selects one of the measurement voltage Vm and external input voltages Vin0 to Vinn to output the selected voltage as an analog input voltage Vin to the A/D converting circuit 106. The control circuit 214 instructs the selecting circuit 204 to select the measurement voltage Vm first in response to an A/D conversion request, and then to select a desired one from the external input voltages Vin0 to Vinn. The control circuit 214 also instructs the A/D converting circuit 106 to A/D convert along with the instruction to the selecting circuit 204.

The register 216 accepts a digital output value Dout outputted from the A/D converting circuit 106 every time the A/D converting circuit 106 A/D converts the measurement voltage Vm. The digital output value Dout resulting from the A/D conversion of the measurement voltage Vm (a register value of the register 216) is expressed by the expression (4) as a transformation of the expressions (1), (3). Since a resistance value of the high-accuracy resistor R may be regarded as a constant, the digital output value Dout resulting from the A/D conversion of the measurement voltage Vm depends only on the resistance value of the thermistor Th, that is, on the ambient temperature of the A/D converter 200. Therefore, this digital output value Dout can be used as temperature information representing the ambient temperature of the A/D converter 200.

$$Dout = \{Th/(R+Th)\} \times 1024 \quad (4)$$

Similarly to the ROM 110 of the first embodiment, the ROM 210 is a nonvolatile memory such as a fuse or EEPROM, and it stores a plurality of measured values (10-bit digital values) of the reference voltage Vref corresponding to temperatures in advance. The ROM 210 selects a measured value corresponding to the temperature represented by the register value of the register 216 to output it to the register 212. Incidentally, similarly to the A/D converter 100 of the first embodiment, the A/D converter 200 has, for example, a monitor pad for monitoring the reference voltage Vref, a write pad and a write circuit for data write to the ROM 210, though they are not shown in the drawing. At the probe inspection during a manufacturing process of the A/D converter 200, the plural measured values of the reference voltage Vref are obtained under various temperature conditions via the monitor pad, and written to the ROM 210 via the write pad and the write circuit.

The register 212 accepts the measured value of the reference voltage Vref outputted from the ROM 210, for example, every time the A/D converting circuit 106 A/D converts each of the external input voltages Vin0 to Vinn. A register value of the register 212 is readable via an external terminal. The measured value of the reference voltage Vref accepted by the register 212 corresponds to the digital output value Dout resulting from the latest A/D conversion of the measurement voltage Vm, in other words, it corresponds to the current ambient temperature of the A/D converter 200. Therefore, a user of the A/D converter 200 obtains the measured value of the reference voltage Vref corresponding to the current ambient temperature of the A/D converter 200 by reading the register value of the register 212.

With the above-described structure, the same effects as those of the first embodiment of the A/D converter are obtainable also in this embodiment. In addition, the measured value of the reference voltage Vref obtained by reading the register value of the register 212 corresponds to the current ambient temperature of the A/D converter 200. This allows a user of the A/D converter 200 to constantly obtain the digital value representing the analog input voltage Vin accurately even when the reference voltage Vref varies with the ambient temperature of the A/D converter 200.

Figure 12:
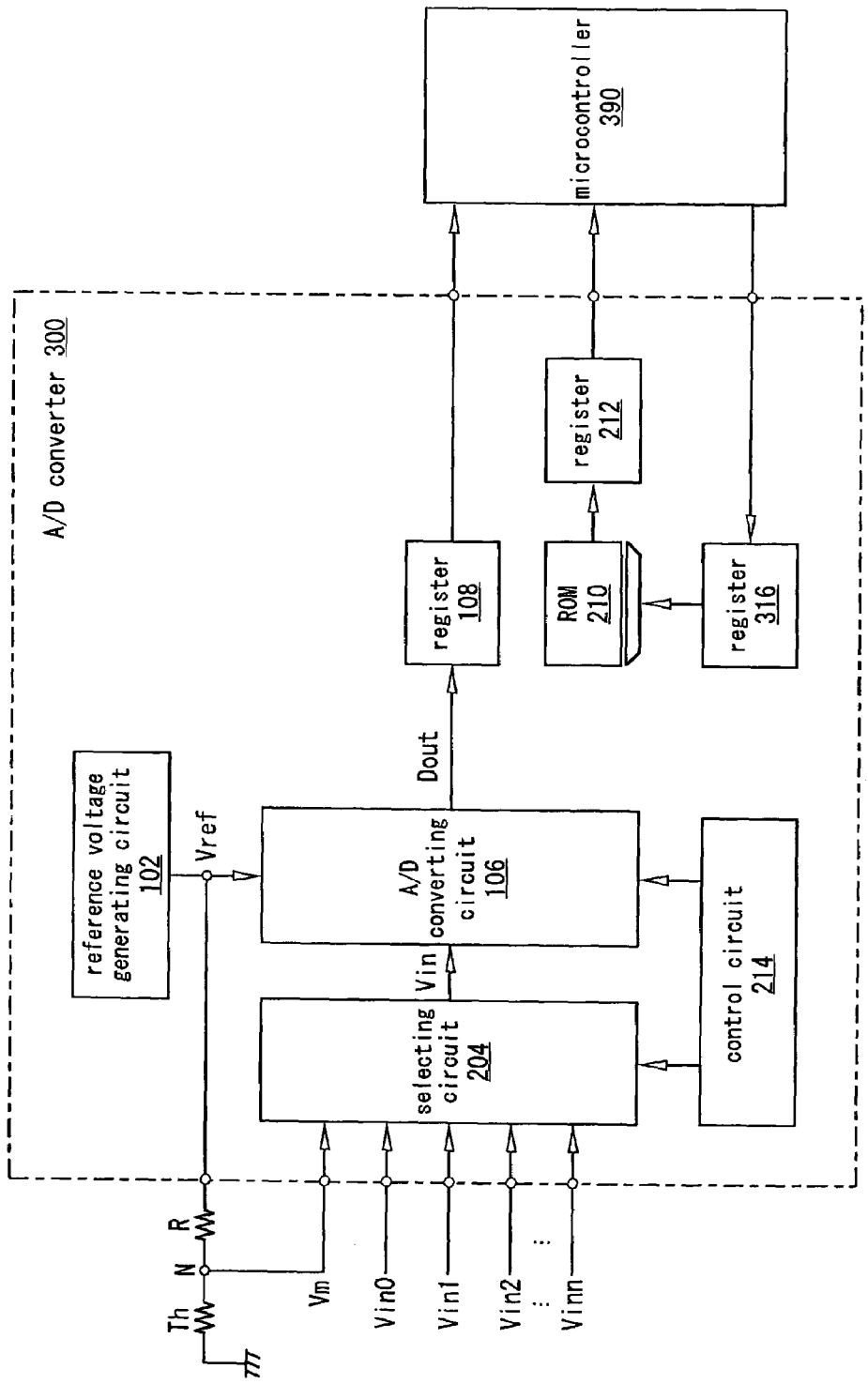
FIG. 12 is a block diagram showing a third embodiment of the A/D converter of the present invention.

FIG. 12 shows a third embodiment of the A/D converter of the present invention. The same reference numerals and symbols are used to designate the same elements as the elements described in the first and second embodiments of the A/D converter, and detailed description thereof will not be given. An A/D converter 300 has a 10-bit register 316 (a temperature information holding circuit) in place of the register 216 of the A/D converter 200 of the second embodiment. The rest of configuration of the A/D converter 300 is the same as that of the A/D converter 200 of the second embodiment. Data write to the register 316 is possible via an external terminal. Further, the A/D converter 300 is connected to a microcontroller 390 (an external control circuit) on a system board.

In the A/D converter 300 as configured above, for example, the microcontroller 390 reads a register value of a register 108 resulting from A/D conversion of a measurement voltage Vm (a digital output value Dout from an A/D converting circuit 106), and calculates a resistance value of a thermistor Th by the expression (4), using the read register value. Then, the calculated resistance value and the temperature characteristic of the thermistor Th are used to find the current ambient temperature of the A/D converter 300, and a digital value corresponding to the found temperature is written to the register 316. In response thereto, a ROM 210 outputs a measured value corresponding to the current ambient temperature of the A/D converter 300 to a register 212.

With the above-described structure, the same effects as those of the first and second embodiments of the A/D converter are obtainable also in this embodiment. In addition, in order to obtain the temperature characteristic of the reference voltage Vref, a user of the A/D converter 300 sequentially obtains measured values thereof outputted from the ROM 210 by reading register values of the register 212 while allowing the microcontroller 390 to vary the digital value to be written to the register 316. Consequently, in a case where the measured value corresponding to the current ambient temperature of the A/D converter 300 is not stored in the ROM 210, for example, it is possible to correct the digital output value Dout from the A/D converting circuit 106, using the obtained temperature characteristic of the reference voltage Vref, and to thus obtain the digital value representing an analog input voltage Vin with higher accuracy. This makes it possible to reduce the number of measured values to be stored in the ROM 210, in other words, the capacity of the ROM 210, simplifying the circuit configuration of the A/D converter 300.

Figure 13:
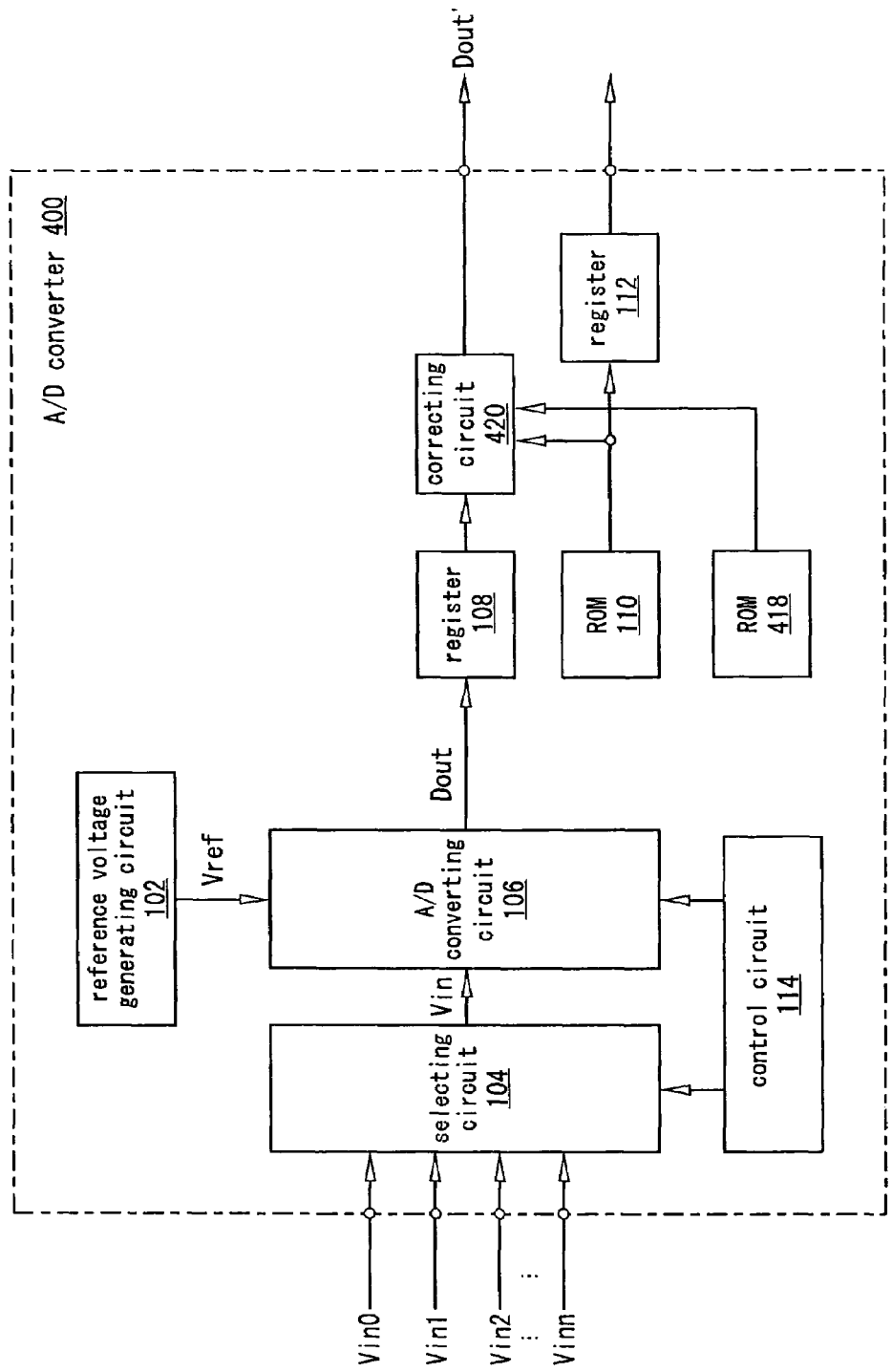
FIG. 13 is a block diagram showing a forth embodiment of the A/D converter of the present invention.

FIG. 13 shows a fourth embodiment of the A/D converter of the present invention. The same reference numerals and symbols are used to designate the same elements as the elements described in the first embodiment of the A/D converter, and detailed description thereof will not be given. An A/D converter 400 is configured by adding a ROM 418 (a standard value storing circuit) and a correcting circuit 420 to the A/D converter 100 of the first embodiment. Similarly to the ROM 110, the ROM 418 is a nonvolatile memory such as a fuse or EEPROM, and it stores a standard value (10-bit digital value) of a reference voltage Vref in advance and outputs the stored standard value to the correcting circuit 420. For example, at the probe inspection during a manufacturing process of the A/D converter 400, the standard value of the reference voltage Vref is written to the ROM 418 as well as a measured value thereof is written to the ROM 110.

According to the measured value from the ROM 110 and the standard value from the ROM 418, the correcting circuit 420 corrects a register value read from the register 108, namely, a digital output value Dout from the A/D converting circuit 106, to a digital value Dout' whose basic value is the standard value of the reference voltage Vref, and outputs the digital value Dout'. The digital value Dout' after the correction is expressed by the following expression (5), where a measured value of the reference voltage Vref is X1 and a standard value of the reference voltage Vref is X2. Therefore, the correcting circuit 420 can be easily configured with a multiplying circuit and a dividing circuit.

$$Dout'=(X2/X1) \times Dout \quad (5)$$

With the above-described structure, the same effects as those of the first embodiment of the A/D converter are obtainable also in this embodiment. In addition, since the digital output value Dout from the A/D converting circuit 106 (the register value read from the register 108) is corrected inside the A/D converter 400, a user of the A/D converter 400 can constantly obtain the digital value Dout' representing an analog input voltage Vin accurately without correcting the digital output value Dout from the A/D converting circuit 106.

Figure 14:
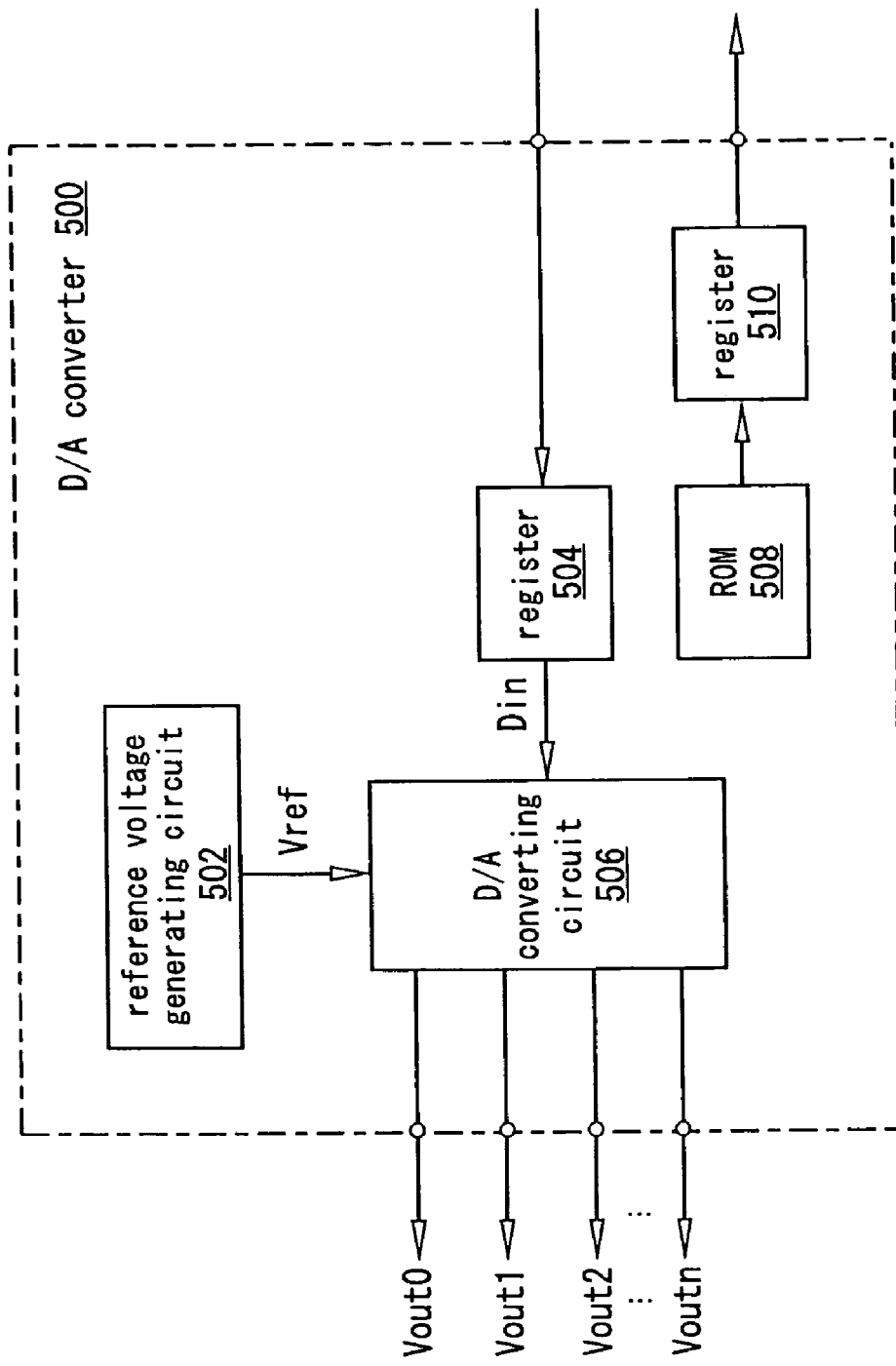
FIG. 14 is a block diagram showing a first embodiment of the D/A converter of the present invention.

FIG. 14 shows a first embodiment of the D/A converter of the present invention. A D/A converter 500 is, for example, an 8-bit D/A converter formed as a semiconductor integrated circuit chip, and it has a reference voltage generating circuit 502, an 8-bit register 504, a D/A converting circuit 506, a ROM 508 (a measured value storing circuit), and an 8-bit register 510. The reference voltage generating circuit 502 generates a reference voltage Vref to output it to the D/A converting circuit 506. The reference voltage generating circuit 502 is structured by using a known bandgap reference circuit BGR, for example, as shown in FIG. 10. Data write to the register 504 is possible via an external terminal. The register 504 outputs a register value thereof as a digital input value Din of the D/A converting circuit 506.

In response to data write to the register 504, the register 504 outputs the digital input value Din. The D/A converting circuit 506 receives and converts the digital input value Din to an analog output voltage according to the reference voltage Vref outputted from the reference voltage generating circuit 502, to output the analog output voltage as a desired one of external output voltages Vout0 to Voutn. The ROM 508, which is a nonvolatile memory such as a fuse or EEPROM, stores a measured value (8-bit digital value) of the reference voltage Vref in advance to output the stored measured value to the register 510. Incidentally, the D/A converter 500 has, for example, a monitor pad for monitoring the reference voltage Vref, a write pad and a write circuit for data write to the ROM 508, though they are not shown in the drawing. At the probe inspection during a manufacturing process of the D/A converter 500, the measured value of the reference voltage Vref is obtained via the monitor pad under a predetermined temperature, and written to the ROM 508 via the write pad and the write circuit.

The register 510 accepts the measured value of the reference voltage Vref outputted from the ROM 508, for example, upon power-on reset of the D/A converter 500. A register value of the register 510 is readable via an external terminal. Therefore, a user of the D/A converter 500 is able to obtain the measured value of the reference voltage Vref by reading the register value of the register 510.

With the D/A converter 500 as configured above, the user reads the register value of the register 510 to obtain the measured value of the reference voltage Vref corresponding to a value of the reference voltage Vref at the time of D/A conversion. Then, the user of the D/A converter 500 writes to the register 504 a digital value whose basic value is the measured value of the reference voltage Vref, so that the external output voltages Vout0 to Voutn (analog output voltages) are accurately generated irrespective of the accuracy of the reference voltage Vref.

As described above, in this embodiment, the D/A converting circuit 506 is supplied, as the digital input value Din, with the digital value whose basic value is the measured value of the reference voltage Vref outputted from the ROM 508, so that the external output voltages Vout0 to Voutn can be accurately generated irrespective of the accuracy of the reference voltage Vref. In addition, a manufacturer of the D/A converter 500 need not trim the reference voltage Vref within a standard range during a manufacturing process of the D/A converter 500; therefore, they can ship D/A converters with a reference voltage Vref of a range not trimmed within the standard range as nondefective products, which have been conventionally regarded as defective. This can enhance a manufacturing yield of the D/A converter 500.

Figure 15:
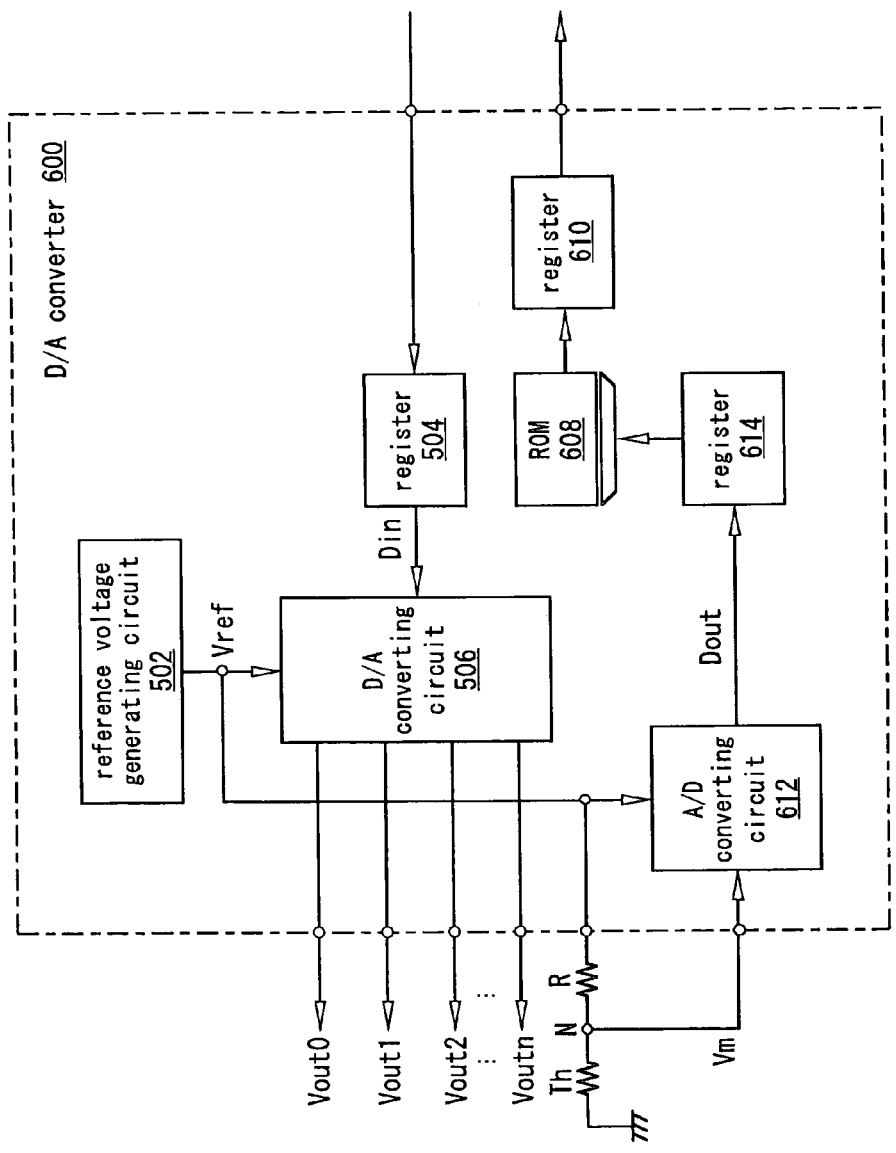
FIG. 15 is a block diagram showing a second embodiment of the D/A converter of the present invention.

FIG. 15 shows a second embodiment of the D/A converter of the present invention. The same reference numerals and symbols are used to designate the same elements as the elements described in the first embodiment of the D/A converter, and detailed description thereof will not be given. Similarly to the D/A converter 500 of the first embodiment, a D/A converter 600 is, for example, an 8-bit D/A converter formed as a semiconductor integrated circuit chip, and it has a reference voltage generating circuit 502, a register 504, a D/A converting circuit 506, a ROM 608 (a measured value storing circuit, an output control circuit), an 8-bit register 610, an A/D converting circuit 612, an 8-bit register 614, and an external high-accuracy resistor R and thermistor Th (a measurement voltage generating circuit).

The high-accuracy register R and the thermistor Th are connected in series between a supply line of a reference voltage Vref and a ground line. A voltage of a connecting node N of the high-accuracy resistor R and the thermistor Th is outputted as a measurement voltage Vm to the A/D converting circuit 612. The high-accuracy register R has temperature independency, in other words, its resistance value is substantially constant irrespective of the ambient temperature of the D/A converter 600. The thermistor Th has temperature dependency, that is, its resistance value varies according to the ambient temperature of the D/A converter 600. Therefore, the measurement voltage Vm varies according to the temperature characteristic of the thermistor Th, in other words, it varies according to the ambient temperature of the D/A converter 600.

In response to an A/D conversion request, the A/D converting circuit 612 compares the measurement voltage Vm as an analog input voltage with the reference voltage Vref to convert the measurement voltage Vm to a digital output value Dout, and outputs the digital output value Dout to the register 614. The register 614 accepts the digital output value Dout outputted from the A/D converting circuit 612 every time the A/D converting circuit 612 A/D converts. The register 614 outputs a register value thereof to the ROM 608. Similarly to the ROM 508 of the first embodiment, the ROM 608 is a nonvolatile memory such as a fuse or EEPROM, and it stores a plurality of measured values (8-bit digital values) of the reference voltage Vref corresponding to temperatures in advance. The ROM 608 selects a measured value corresponding to a temperature represented by the register value of the resistor 614 to output the selected measured value to the register 610. Incidentally, similarly to the D/A converter 500 of the first embodiment, the D/A converter 600 has, for example, a monitor pad for monitoring the reference voltage Vref, a write pad and a write circuit for data write to the ROM 608, though they are not shown in the drawing. At the probe inspection during a manufacturing process of the D/A converter 600, the plural measured values of the reference voltage Vref are obtained via the monitor pad under various temperature conditions, and written to the ROM 608 via the write pad and the write circuit.

The register 610 accepts the measured value of the reference voltage Vref outputted from the ROM 608, for example, every time the A/D converting circuit 612 A/D converts. A register value of the register 610 is readable via an external terminal. The measured value of the reference voltage Vref accepted by the register 610 corresponds to the digital output value Dout resulting from the latest A/D conversion of the measurement voltage Vm, in other words, it corresponds to the current ambient temperature of the D/A converter 600. Therefore, a user of the D/A converter 600 reads the register value of the register 610 to obtain the measured value of the reference voltage Vref corresponding to the current ambient temperature of the D/A converter 600.

With the above-described structure, the same effects as those of the first embodiment of the D/A converter are obtainable also in this embodiment. In addition, the measured value of the reference voltage Vref obtained by reading the register value of the register 610 corresponds to the current ambient temperature of the D/A converter 600. This enables constant generation of accurate external output voltages Vout0 to Voutn, even when the reference voltage Vref varies with the ambient temperature of the D/A converter 600.

Figure 16:
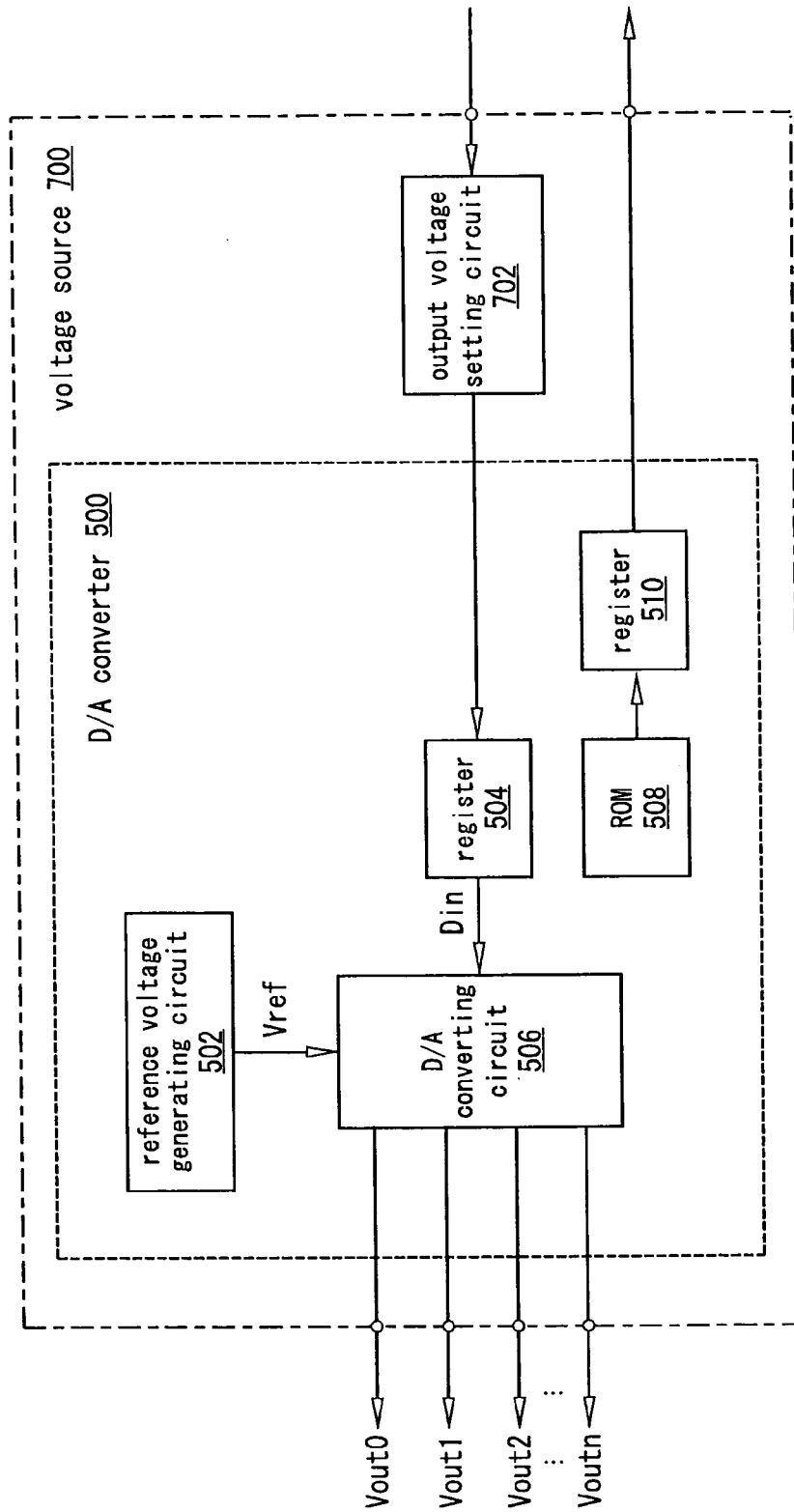
FIG. 16 is a block diagram showing a first embodiment of the voltage source of the present invention.

FIG. 16 shows a first embodiment of the voltage source of the present invention. The same reference numerals and symbols are used to designate the same elements as the elements described in the first embodiment of the D/A converter, and detailed description thereof will not be given. A voltage source 700 has an output voltage setting circuit 702 and the D/A converter 500 of the first embodiment. A user of the voltage source 700 sets digital value corresponding to a desired output voltage to the output voltage setting circuit 702. The output voltage setting circuit 702 writes the set digital value to the register 504 of the D/A converter 500. Therefore, the D/A converter 500 uses the digital value set at the output voltage setting circuit 702 as a digital input value Din. The D/A converting circuit 506 of the D/A converter 500 outputs external output voltages Vout0 to Voutn as output voltages of the voltage source 700.

As described above, this embodiment enables generation of accurate output voltages irrespective of the accuracy of the reference voltage Vref by setting at the output voltage setting circuit 702 a digital value whose basic value is the measured value of a reference voltage Vref obtained by reading a register value of the register 510. In addition, a manufacturer of the voltage source 700 need not trim the reference voltage Vref within a standard range during a manufacturing process of the voltage source 700, so that they can ship voltage sources with a reference voltage Vref of a range not trimmed within the standard range as nondefective products, which have been regarded as defective conventionally. This can enhance a manufacturing yield of the voltage sources 700.

Figure 17:
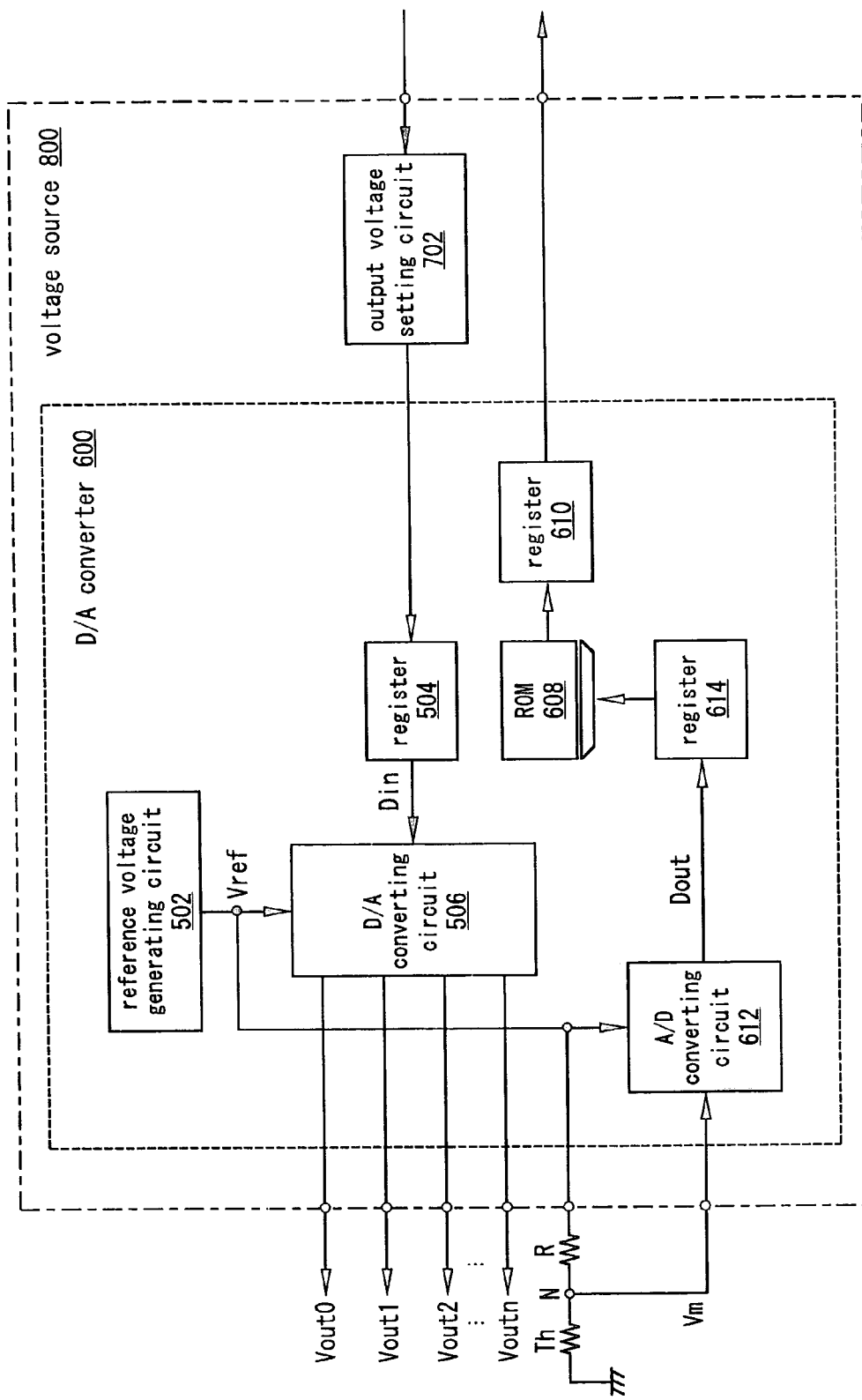
FIG. 17 is a block diagram showing a second embodiment of the voltage source of the present invention.

FIG. 17 shows a second embodiment of the voltage source of the present invention. The same reference numerals and symbols are used to designate the same elements as the elements described in the first and second embodiments of the D/A converter and the first embodiment of the voltage source, and detailed description thereof will not be given. A voltage source 800 has an output voltage setting circuit 702 and the D/A converter 600 of the second embodiment. The output voltage setting circuit 702 writes a set digital value to the register 504 of the D/A converter 600. Therefore, the D/A converter 600 uses the digital value set to the output voltage setting circuit 702 as a digital input value Din. The D/A converting circuit 506 of the D/A converter 600 outputs external output voltages Vout0 to Voutn as output voltages of the voltage source 800.

As described above, the same effects as those of the first embodiment of the voltage source are obtainable also in this embodiment. In addition, a measured value of a reference voltage Vref is obtained by reading a register value of the register 610, and it corresponds to the current ambient temperature of the voltage source 800. This enables constant generation of accurate output voltages even when the reference voltage Vref varies with the ambient temperature of the voltage source 800.

The invention is not limited to the above embodiments and various modifications may be made without departing from the spirit and scope of the invention. Any improvement may be made in part or all of the components.

What is claimed is:

1. An A/D converter comprising:
a reference voltage generating circuit generating a reference voltage;
an A/D converting circuit comparing an analog input voltage with the reference voltage to convert the analog input voltage to a digital output value;

a measured value storing circuit storing therein a measured value of the reference voltage in advance and outputting the stored measured value;

a temperature information holding circuit holding temperature information representing a current ambient temperature of the A/D converter; and an output control circuit selecting a measured value corresponding to the temperature information held by said temperature information holding circuit from measured values stored in said measured value storing circuit, and outputting the selected measured value.

2. The A/D converter according to claim 1, further comprising:

a measurement voltage generating circuit generating a measurement voltage for temperature measurement that varies with an ambient temperature of the A/D converter; and a selecting circuit selecting, for output to said A/D converting circuit, the measurement voltage as the analog input voltage, and thereafter selecting an external input voltage for output, wherein said temperature information holding circuit holds as the temperature information a digital output value that is outputted from said A/D converting circuit in response to the selection of the measurement voltage by said selecting circuit.

3. The A/D converter according to claim 2, wherein:

said measurement voltage generating circuit has a first resistor element and a second resistor element connected in series between a supply line of the reference voltage and a ground line, the first resistor element having temperature independency, the second resistor element having temperature dependency; and the measurement voltage is a voltage of a connecting node between the first resistor element and the second resistor element.

4. The A/D converter according to claim 1, further comprising:

a measurement voltage generating circuit generating a measurement voltage for temperature measurement that varies with the ambient temperature of the A/D converter; and a selecting circuit selecting, for output to said A/D converting circuit, the measurement voltage as the analog input voltage, and thereafter selecting an external input voltage for output, wherein said temperature information holding circuit holds a digital value corresponding to a temperature as the temperature information, the temperature being determined by an external control circuit according to the digital output value that is outputted from said A/D converting circuit in response to the selection of the measurement voltage by said selecting circuit.

5. The A/D converter according to claim 4, wherein:

said measurement voltage generating circuit has a first resistor element and a second resistor element connected in series between a supply line of the reference voltage and a ground line, the first resistor element having temperature independency, the second resistor element having temperature dependency; and the measurement voltage is a voltage of a connecting node between the first resistor element and the second resistor element.

6. An A/D converter comprising:

a reference voltage generating circuit generating a reference voltage;

an A/D converting circuit comparing an analog input voltage with the reference voltage to convert the analog input voltage to a digital output value;

a measured value storing circuit storing therein a measured value of the reference voltage in advance and outputting the stored measured value;

a standard value storing circuit storing therein a standard value of the reference voltage in advance and outputs the stored standard value; and a correcting circuit correcting the digital output value from said A/D converting circuit to a digital value according to the measured value of the reference voltage from said measured value storing circuit and to the standard value of the reference voltage from said standard value storing circuit, and outputting the digital value whose basic value is the standard value of the reference voltage.

* * * * *